(12) United States Patent
Islam et al.

(10) Patent No.: US 10,075,149 B2
(45) Date of Patent: Sep. 11, 2018

(54) METHODS AND APPARATUS SUPPORTING CONTROLLED TRANSMISSION AND RECEPTION OF MESSAGES

(71) Applicant: QUALCOMM Incorporated, San Diego, CA (US)

(72) Inventors: Muhammad Nazmul Islam, Edison, NJ (US); Sundar Subramanian, Bridgewater, NJ (US); Junyi Li, Chester, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/476,887

(22) Filed: Mar. 31, 2017

(65) Prior Publication Data

US 2018/0115305 A1    Apr. 26, 2018

Related U.S. Application Data

(60) Provisional application No. 62/412,617, filed on Oct. 25, 2016.

(51) Int. Cl.
*H04B 1/18* (2006.01)
*H03J 5/24* (2006.01)
(Continued)

(52) U.S. Cl.
CPC .............. *H03J 5/242* (2013.01); *H03J 7/047* (2013.01); *H03J 7/186* (2013.01); *H03J 9/002* (2013.01);
(Continued)

(58) Field of Classification Search
CPC ..... H04W 88/08; H04W 16/14; H04W 52/42; H04W 72/04; H04W 24/02;
(Continued)

(56) References Cited

U.S. PATENT DOCUMENTS 7,822,440 B2    10/2010   Park et al.
8,385,362 B2    2/2013    Shao et al.
(Continued)

FOREIGN PATENT DOCUMENTS

JP      2003018074 A      1/2003

OTHER PUBLICATIONS

International Search Report and Written Opinion—PCT/US2017/054406—ISA/EPO—Dec. 13, 2017.
(Continued)

*Primary Examiner* — Ajibola Akinyemi
(74) *Attorney, Agent, or Firm* — Clint R. Morin; Arent Fox

(57) ABSTRACT

Methods and apparatus that support controlled transmission and directional reception of RTS and/or CTS messages, are described. Controlled transmission may include transmitting a same RTS message multiple times in the same direction and/or transmitting an RTS message with a length that is multiple times longer than a standard RTS message. In an aspect, a receiver may determine spatial directions of a plurality of transmitters including a first transmitter and at least one other transmitter, and may perform a beam sweep in the determined spatial directions for receiving one or more RTS messages. A transmitter may determine that a receiver is to perform a beam sweep in K different spatial directions, and may transmit a same RTS message for a data transmission K times in the same direction or an RTS message with a length approximately K times longer than a standard RTS message, during a duration of the beam sweep.

30 Claims, 15 Drawing Sheets

(51) Int. Cl.
*H03J 7/04* (2006.01)
*H03J 7/18* (2006.01)
*H03J 9/00* (2006.01)
*H04B 7/0417* (2017.01)
*H04N 5/50* (2006.01)
*H04W 74/08* (2009.01)

(52) U.S. Cl.
CPC ............ *H04B 7/0417* (2013.01); *H04N 5/50* (2013.01); *H04W 74/0816* (2013.01); *H03J 2200/27* (2013.01)

(58) Field of Classification Search
CPC . H04W 52/241; H04W 28/06; H04W 72/044; H04W 72/085; H04W 52/265; H04W 72/042; H04W 72/0453; H04W 16/28
USPC ...................................................... 455/167.1
See application file for complete search history.

(56) References Cited

U.S. PATENT DOCUMENTS

| | | | |
|---|---|---|---|
| 8,867,380 | B2 | 10/2014 | Gorokhov et al. |
| 2006/0040675 | A1* | 2/2006 | Halfmann ............ H04W 16/28 455/456.1 |
| 2015/0373593 | A1 | 12/2015 | Ryu et al. |
| 2016/0323755 | A1 | 11/2016 | Cordeiro et al. |
| 2017/0105224 | A1* | 4/2017 | Ghanbarinejad ..... H04L 5/0055 |
| 2017/0127367 | A1* | 5/2017 | Axnas ............... H04W 56/0015 |

OTHER PUBLICATIONS

Morioka Y., (Sony Corporation): "802.11 ad-New-Technique-Sony: 11-10-0259-00-00ad-11ad-new-technique-sony", IEEE Draft; IEEE-SA Mentor, Piscataway, NJ USA, vol. 802.11ad, Mar. 1, 2010, pp. 1-14, XP017677425, [retrieved on Mar. 1, 2010].

\* cited by examiner

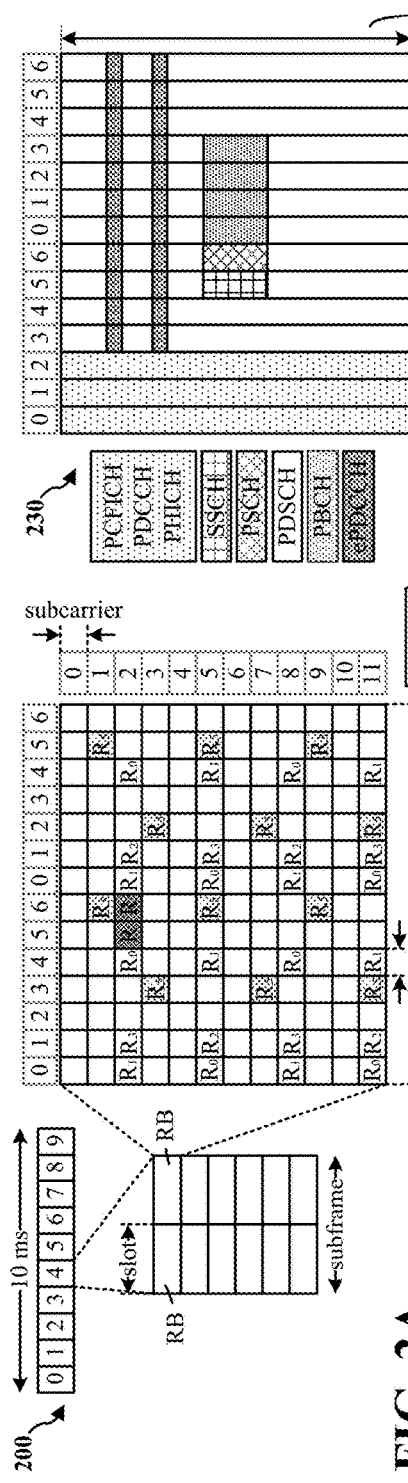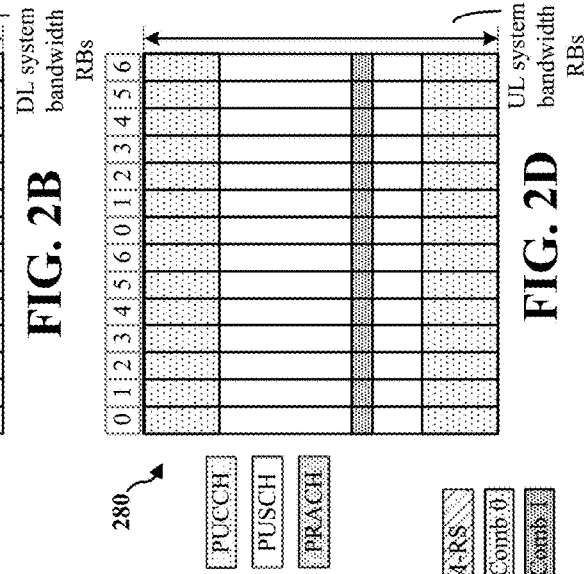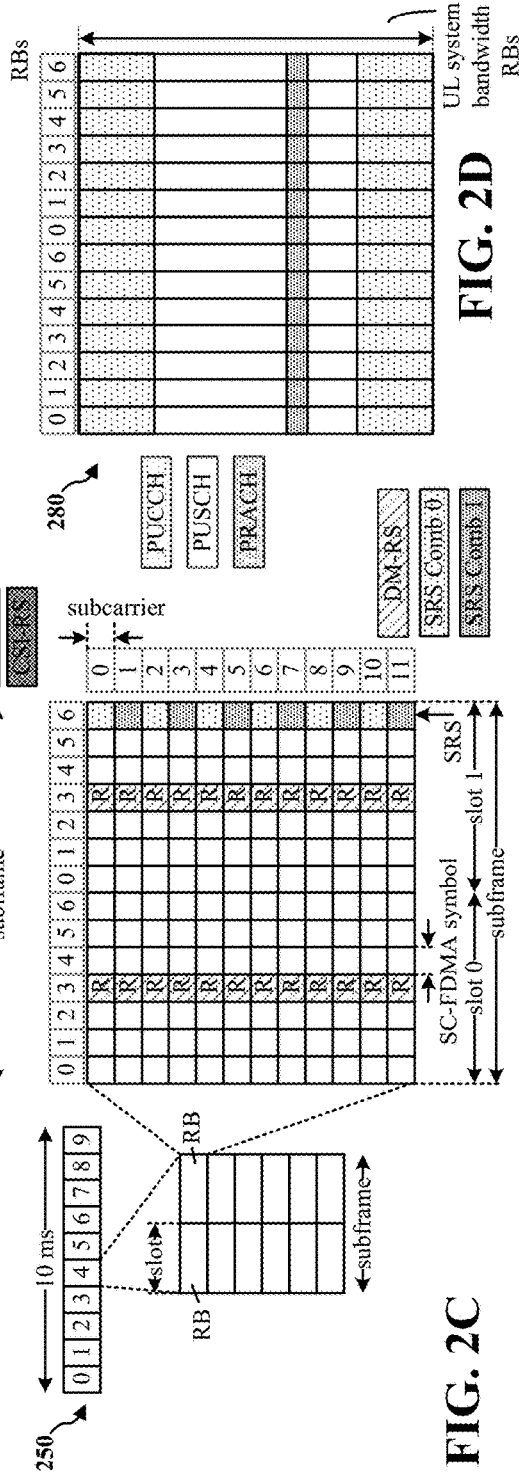
FIG. 2A    FIG. 2B    FIG. 2C    FIG. 2D

METHODS AND APPARATUS SUPPORTING CONTROLLED TRANSMISSION AND RECEPTION OF MESSAGES

CROSS-REFERENCE TO RELATED APPLICATION(S)

This application claims the benefit of U.S. Provisional Application Ser. No. 62/412,617, entitled "METHODS AND APPARATUS SUPPORTING CONTROLLED TRANSMISSION AND RECEPTION OF MESSAGES" filed on Oct. 25, 2016, which is expressly incorporated by reference herein in its entirety.

BACKGROUND

Field

The present disclosure relates generally to communication systems, and more particularly, to methods and apparatus that support controlled transmission and directional reception of messages, e.g., request to send (RTS) messages and/or clear to send (CTS) messages.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE). LTE is a set of enhancements to the Universal Mobile Telecommunications System (UMTS) mobile standard promulgated by Third Generation Partnership Project (3GPP). LTE is designed to support mobile broadband access through improved spectral efficiency, lowered costs, and improved services using OFDMA on the downlink, SC-FDMA on the uplink, and multiple-input multiple-output (MIMO) antenna technology. However, as the demand for mobile broadband access continues to increase, there exists a need for further improvements in LTE technology. These improvements may also be applicable to other multi-access technologies and the telecommunication standards that employ these technologies.

In a wireless communication system, such as one compliant with the IEEE 802.11ad standard and/or other such communication standards, a receiving device may remain in omni-directional mode while receiving RTS messages from one or more transmitting devices. When the system becomes more dense, multiple devices may transmit RTS messages at the same time, causing interference to other devices. Due to the interference, intended recipients of the RTS messages may not transmit a CTS message and further rounds of contention involving more RTS/CTS signaling exchange may be needed.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In a wireless communication system, such as one compliant with the IEEE 802.11ad standard and/or any other communication standard, a receiving device may remain in omni-directional mode while receiving RTS messages from one or more transmitting devices. When the system becomes more congested, multiple devices may transmit RTS messages at the same time, causing interference to other devices. Due to the interference or over estimation of interference, intended recipients of the RTS messages may not transmit a CTS message in response to the RTS message and the potential transmitters may likely participate again in the RTS/CTS exchange during a contention based access period (CBAP) thereby increasing the overhead associated with RTS/CTS signaling as well as overall network congestion.

To reduce network congestion and increase medium reuse, RTS may be transmitted multiple times and/or for a longer duration in a manner that allows a receiver to detect the transmitted RTS during at least one time interval associated with reception of RTS messages, e.g., in a CBAP. In some configurations, receiving and transmitting devices may perform beam training during a beamforming training phase, e.g., which may correspond to a beamforming training interval of a 802.11ad beacon interval structure. Thus in some configurations, the receiving device may determine, e.g., learn, the spatial directions in which each of the transmitting devices may transmit based on the information exchanged during the beam training phase. The receiving device may then select a sweeping pattern for receiving transmission from each of the neighboring transmitting devices. The receiving device may perform, based on the determined spatial directions, a beam sweep for receiving one or more RTS messages. In some aspects performing the beam sweep includes listening, e.g., scanning, for an RTS message in each of the determined spatial directions. The receiving device may listen for one or more RTS messages in each of the determined spatial directions, e.g., during different time intervals and may selectively perform a beam sweep in selected spatial directions corresponding to potential transmitters in a directional manner to detect RTS messages from the potential transmitters in at least one of the different spatial directions. In some aspects the beam sweep may be performed in each of the determined spatial directions. The receiver may select a sweeping pattern to avoid performing a beam sweep to listen in one or more particular directions, e.g., in spatial directions where there may be no potential transmitter. Accordingly the receiving device may detect and receive an RTS transmission from a first transmitter in a first spatial direction while performing a beam sweep in the first spatial direction and may detect and receive an RTS transmission from a second transmitter in a second spatial direction while performing a beam sweep in the second spatial direction. In some aspects the beam sweep is performed in accordance with a selected beam sweeping pattern. However the devices transmitting RTS messages may not, and in some aspects do not, know the beam sweeping pattern used by the receiving device. In some aspects the receiver devices is one of a base station, access point, relay, user equipment (UE) or a customer premises equipment (CPE).

In accordance with an aspect, a plurality of potential transmitters, e.g., UEs, associated with the receiving device, e.g., a base station or another UE, may be in different spatial directions with respect to the receiving device. In one aspect while the transmitters do not know the beam sweeping pattern used by the receiver for scanning for RTS messages in different spatial direction, the transmitting devices determine that the receiver is to perform a beam sweep in K different spatial directions, with each of the transmitters being in a spatial direction of the K different spatial directions. Thus a first transmitter may be in a first spatial direction with respect to the receiving device and a second transmitter may be in a second spatial direction with respect to the receiving device. In accordance with one aspect of the disclosure, a transmitter in a given spatial direction of the K different spatial directions may transmit a same RTS message multiple times, e.g., K times, periodically during the duration of the beam sweep thus allowing the receiver to detect the transmitter's RTS message transmission during at least one time interval of the beam sweep in which the receiver listens for RTS transmissions in the given direction. In accordance with another aspect a transmitter in a given spatial direction may not transmit a same RTS message multiple times, but rather transmits an RTS message with longer length, e.g., K times longer, than a standard RTS message during the duration of the beam sweep thus allowing the receiver to hear the transmitter's RTS message during at least one time interval in which the receiver listens for RTS transmissions in the given direction.

In an aspect of the disclosure, a method, a computer-readable medium, and an apparatus are provided. The apparatus may be configured to determine spatial directions of a plurality of transmitters including a first transmitter and at least one other transmitter. The apparatus may be further configured to perform, based on the determined spatial directions, a beam sweep for receiving one or more RTS messages. The apparatus may perform the beam sweep by listening for an RTS message in each of the determined spatial directions.

In another aspect of the disclosure, a method, computer-readable medium, and an apparatus are provided. The apparatus may be configured to determine that a receiver is to perform a beam sweep in K different spatial directions, the wireless communication device being in a first spatial direction of the K different spatial directions with respect to the receiver. The apparatus may be further configured to transmit a same RTS message for a data transmission K times consecutively during a duration of the beam sweep.

In another aspect of the disclosure, a method, computer-readable medium, and an apparatus are provided. The apparatus may be configured to determine that a receiver is to perform a beam sweep in K different spatial directions, the transmitter being in a first spatial direction of the K different spatial directions with respect to the receiver. The apparatus may be further configured to generate a RTS message with a length approximately K times longer than a standard RTS message. The apparatus may be further configured to transmit the generated RTS message during a duration of the beam sweep.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 2A, 2B, 2C, and 2D are diagrams illustrating LTE examples of a DL frame structure, DL channels within the DL frame structure, an UL frame structure, and UL channels within the UL frame structure, respectively.

DETAILED DESCRIPTION

Figure 1:
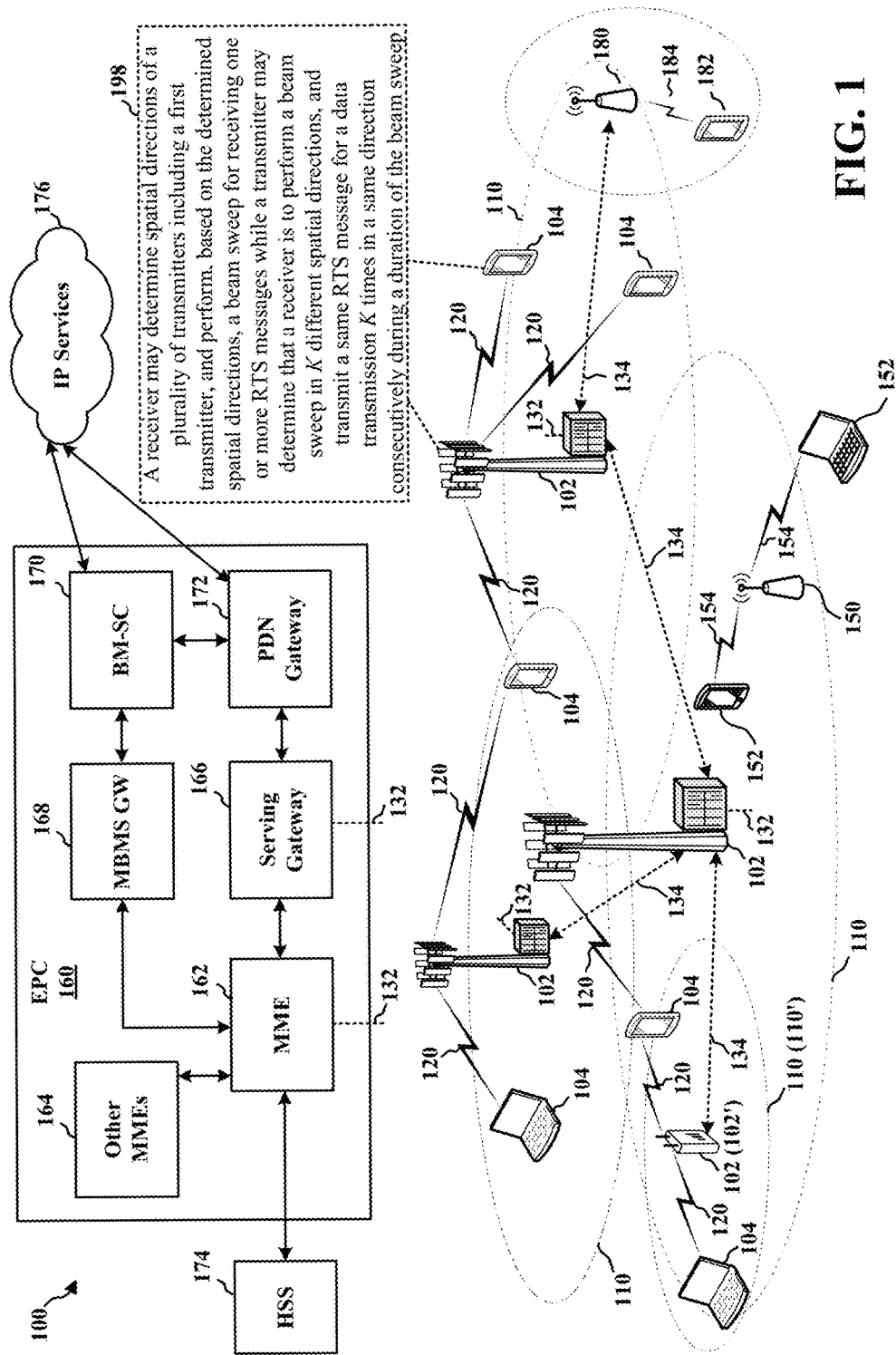
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ LTE and use the same 5 GHz unlicensed frequency spectrum as used by the Wi-Fi AP 150. The small cell 102', employing LTE in an unlicensed frequency spectrum, may boost coverage to and/or increase capacity of the access network. LTE in an unlicensed spectrum may be referred to as LTE-unlicensed (LTE-U), licensed assisted access (LAA), or MuLTEfire.

The millimeter wave (mmW) base station 180 may operate in mmW frequencies and/or near mmW frequencies in communication with the UE 182. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 182 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, a receiving device (e.g., the UE 104 or the eNB 102) may be configured (198) to determine spatial directions of a plurality of transmitters including a first transmitter and at least one other transmitter, and perform, based on the determined spatial directions, a beam sweep for receiving one or more RTS messages, where performing the beam sweep comprises listening for an RTS message in at least one of the determined spatial directions. Furthermore a transmitting device (e.g., the UE 104 or the eNB 102) may be configured (198) to perform controlled transmissions of RTS messages, e.g., multiple transmissions of a same RTS message in a same direction and/or transmission of an RTS message having a length K times longer than a standard RTS message. For example, in certain aspects, the transmitting device may be configured (198) to determine that a receiver is to perform a beam sweep in K different spatial directions, the transmitter being in a first spatial direction of the K different spatial directions with respect to the receiver, and transmit a same request to send (RTS) message for a data transmission K times in a same direction consecutively during a duration of the beam sweep.

FIG. 2A is a diagram 200 illustrating an example of a DL frame structure in LTE. FIG. 2B is a diagram 230 illustrating an example of channels within the DL frame structure in LTE. FIG. 2C is a diagram 250 illustrating an example of an UL frame structure in LTE. FIG. 2D is a diagram 280 illustrating an example of channels within the UL frame structure in LTE. Other wireless communication technologies may have a different frame structure and/or different channels. In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The physical broadcast channel (PBCH) is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
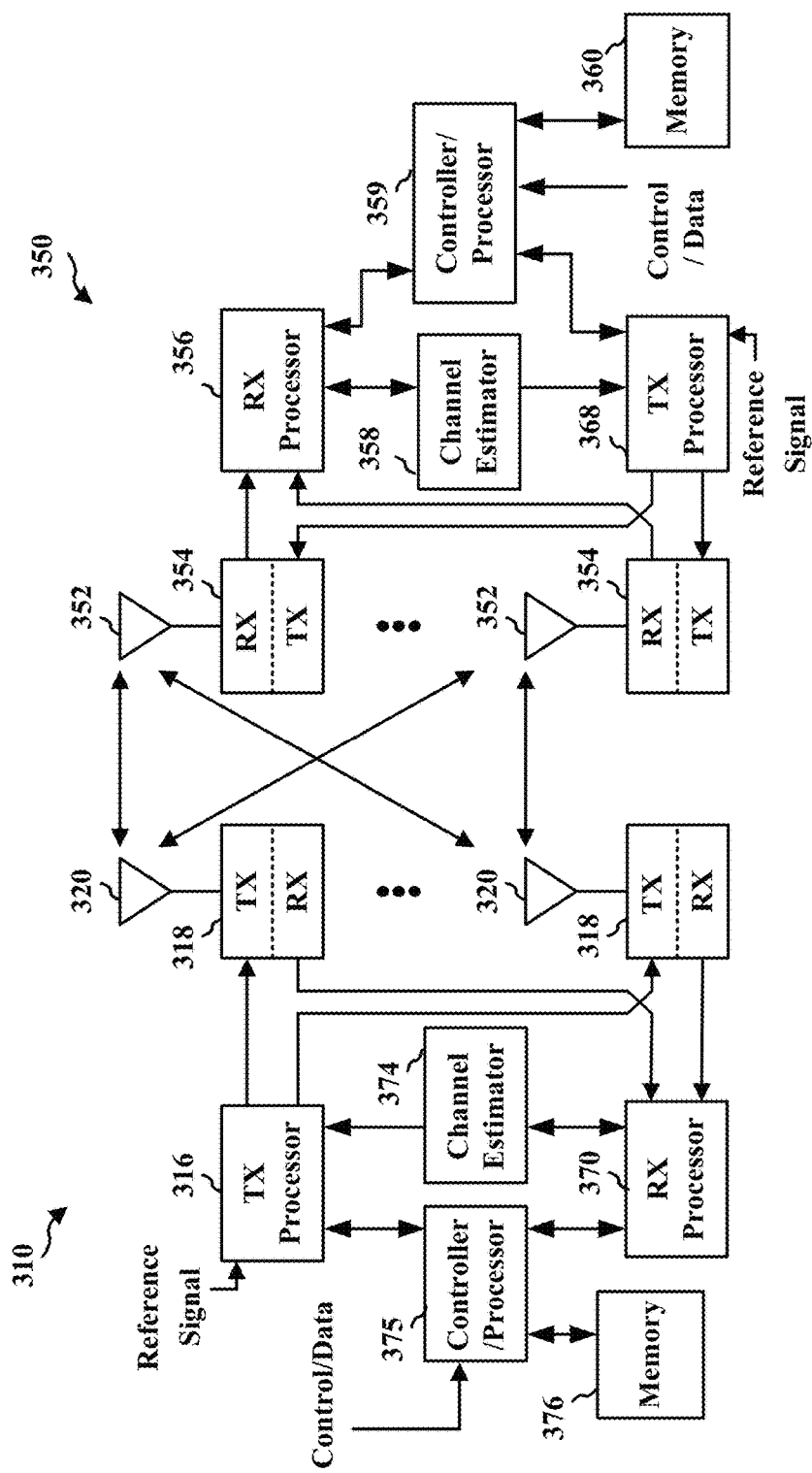
FIG. 3 is a diagram illustrating an example of an evolved Node B (eNB) and user equipment (UE) in an access network.

FIG. 3 is a block diagram of an eNB 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Figure 4:
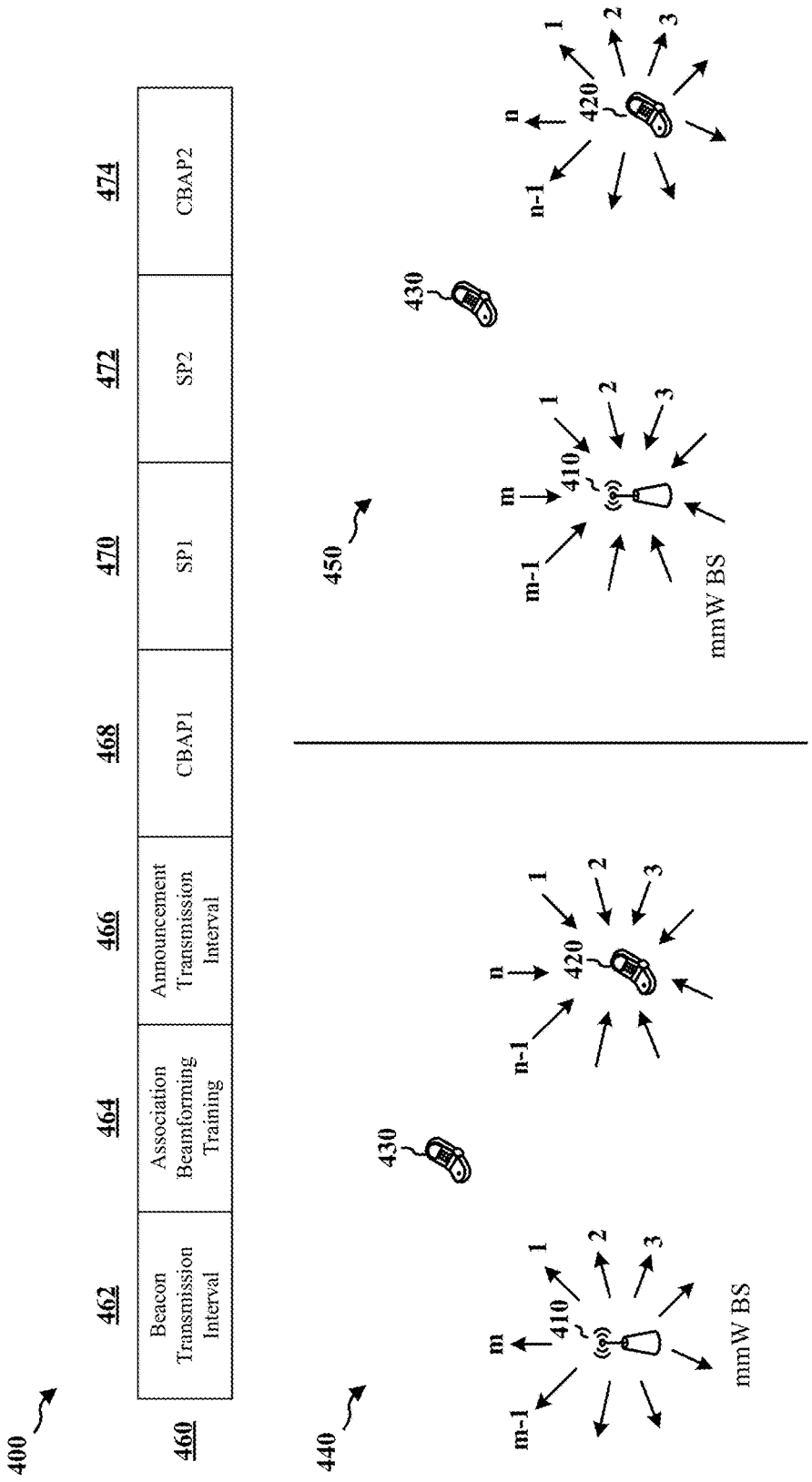
FIG. 4 illustrates a diagram of access periods within a beacon interval timing structure and diagrams of a communication system that supports mmW network operations.

FIG. 4 illustrates a diagram 400 of access periods within a beacon interval timing structure 460 and diagrams 440, 450 of a mmW network. In the diagram 440, for example, the mmW network includes a mmW base station 410 and a number of UEs 420, 430. The base station 410 may include hardware for performing analog and/or digital beamforming. If the base station 410 is equipped with analog beamforming, at any one time, the base station 410 may transmit or receive a signal in one direction. If the base station 410 is equipped with digital beamforming, the base station 410 may concurrently transmit multiple signals in multiple directions or may receive multiple signals concurrently in multiple directions. Further, the UE 420, for example, may include hardware for performing analog and/or digital beamforming. If the UE 420 is equipped with analog beamforming, at any one time, the UE 420 may transmit or receive a signal in only one direction. If the UE 420 is equipped with digital beamforming, the UE 420 may concurrently transmit multiple signals in multiple directions or may concurrently receive multiple signals in multiple directions.

Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters (the super high frequency (SHF) band extends between 3 GHz and 30 GHz, also referred to as a centimeter wave). While the disclosure herein refers to mmWs, it should be understood that the disclosure also applies to near mmWs. Further, while the disclosure herein refers to mmW base stations, it should be understood that the disclosure also applies to near mmW base stations. Furthermore while one or more base stations may be referred to as mmW base stations, such as the base station 410, the one or more base stations are also capable of supporting operations outside the millimeter wave band. Thus it should be appreciated that while such base stations support operations in the millimeter wave band, operations in other radio frequency bands are supported as well in some embodiments.

In order to build a useful communication network in the millimeter wavelength spectrum, a beamforming technique may be used to compensate for path loss. Beamforming technique focuses the RF energy into a narrow direction (in contrast to omni directional transmissions) to allow the RF beam to propagate farther in that direction. Using the beamforming technique, non-line of sight (NLOS) RF communication in the millimeter wavelength spectrum may rely on reflection and/or diffraction of the beams to reach the UE. If the direction becomes blocked, either because of UE movement or changes in the environment (e.g., obstacles, humidity, rain, etc.), the beam may not be able to reach the UE. Thus, in order to ensure that the UE has continuous, seamless coverage, multiple beams in as many different direction as possible may be available. In an aspect, for advantageous use of the beamforming technique it is desirable that the mmW base stations and the UEs transmit and receive in a direction that allows the most RF energy to be collected.

In accordance with one aspect, in some embodiments one or more devices in the mmW network perform beam sweeps. The beam sweeps may be performed as illustrated in the diagram 440 and/or the diagram 450. Referring to the diagram 440, in a beam sweep, the mmW base station 410 may transmit m beacons in a beamformed manner in a plurality of different spatial directions. The directional transmission of information in a beamformed manner may sometimes be referred to as transmitting a beam or beamformed transmission or simply beaming. In an aspect, the mmW base station 410 may transmit the beacons during a beacon transmission interval 462. The UE 420 listens/scans for the beam transmissions from the mmW base station 410 in n different receive spatial directions. When listening/scanning for the beam transmissions, the UE 420 may listen/scan for the beam sweep transmission from the mmW base station 410 m times in each of the n different receive spatial directions (a total of m*n scans). In some other embodiments the UE 420 may simply listen/scan for transmissions, e.g., beacons and/or other messages, for the duration of the beacon transmission interval 462 without performing beam sweep, e.g., without listening for transmission from the base station in the different receive spatial directions. Since the base station is transmitting beamformed beacons in m different directions in the beacon transmission interval, the UE may receive a beacon transmission during a time period within the beacon transmission interval 462. In an aspect, the listening/scanning may occur during an association beamforming training period 464. In some embodiments in the association beamforming training period 464 handshaking between the transmitting and receiving devices occurs upon beacon reception. Additionally, further refinement of beam tracking may also occur during association beamforming training period 464. In one aspect when listening/scanning for the beam transmissions with digital beamforming, the UE 420 may listen/scan in each beam direction of the m beam directions, and apply different weights (phase and/or amplitude changes) to determine a received signal for n different receive directions of the m transmissions (a total of m scans). The beamforming training may allow a receiving device, e.g., a base station or UE which is to receive a data transmission from another device, to determine the spatial directions in which potential transmitters are located, and may allow a transmitting device, e.g., UE or a base station which is to transmit data, to determine the spatial direction of the receiving device.

In another configuration, referring to the diagram 450, in some embodiments the base stations in the mmW network perform beam sweeps, e.g., to scan for transmissions from other transmitting devices such as UEs, relays, access points and/or other customer devices capable of operations in the mmW network. In a beam sweep by the base station 410, the mmW base station 410 listens/scans for the beam transmissions from the UE 420 in m different receive spatial directions. When listening/scanning for the beam transmissions, the mmW base station 410 may listen/scan for the beam sweep transmission from the UE 420 n times in each of the m different receive spatial directions (a total of m*n scans). Alternatively, when listening/scanning for the beam transmissions with digital beamforming, the mmW base station 410 may listen/scan for each beam direction of then beam directions, and apply different weights (phase and/or amplitude changes) to determine a received signal for m different receive directions of the n transmissions (a total of n scans). In some other embodiments in a beam sweep, the UE 420 may transmit one beam in each of the plurality of different spatial directions and the mmW base station 410 performs a beam sweep scan to listen to the beam transmissions from the UE 420 in m different receive spatial directions.

Based on the performed beam sweeps, the UEs and/or the mmW base stations determine a channel quality associated with the performed beam sweeps. For example, if the beam sweep process in diagram 440 is performed, the UE 420 may determine the channel quality associated with the performed beam sweeps. However, if the beam sweep process in the diagram 450 is performed, the mmW base station 410 may determine the channel quality associated with the performed beam sweeps. If the UE 420 determines a channel quality associated with the performed beam sweeps, the UE 420 may send the channel quality information (also referred to as beam sweep result information) to the mmW base station 410. If the mmW base station 410 determines a channel quality associated with the performed beam sweeps, the mmW base station 410 may send the beam sweep result information to UE 420.

In an aspect, the channel quality may be affected by a variety of factors. The factors include movement of the UE 420 along a path or due to rotation (e.g., a user holding and rotating the UE 420), movement along a path behind obstacles or within particular environmental conditions (e.g., obstacles, rain, humidity). The UE 420 and the mmW base station 410 may also exchange other information, such as configuration information, for beamforming (e.g., analog or digital beamforming capabilities, beamforming type, timing information, etc.). In some configurations, a receiving device that may perform a beam sweep in a plurality of different spatial directions, e.g., to scan for RTS messages from potential transmitting devices, may determine the spatial directions in which various transmitting devices may transmit based on information/signaling exchanged between the transmitters and the receivers during the beamforming training interval 464 and/or the announcement transmission interval 466.

Referring to diagram 400, further during an announcement transmission interval 466, the mmW base station 410 may indicate which stations will receive/get which service period (SP) for use in communication, such as SP1 470 or SP2 472. Within a SP, UEs may communicate in pre-allocated or dynamically allocated slots, and contention is not needed. During the announcement transmission interval 466, the mmW base station 410 may indicate a timing window of a contention based access period (CBAP). During a CBAP, such as CBAP1 468 and/or CBAP2 474, UEs may contend for channel access using an RTS/CTS message exchange. In such an exchange, a first transmitter (e.g., a UE or other device) with data to transmit to another device, e.g., a receiver which may be a base station or another UE, may first transmit an RTS message. The RTS message may include a frame control field, a duration field, a receiver address, a transmitter address, and a frame check sequence (FCS). Upon receiving the RTS message, the receiving device may determine if the channel is clear or otherwise available for transmission. If so, then the device receiving the RTS message may transmit a clear to send (CTS) message. The CTS message may include a frame control field, a duration field, a receiver address, and a frame check sequence (FCS). The CTS message indicates that the channel is clear for data transmission.

Although FIG. 4 shows beam training between the mmW base station 410 and UE 430, beam training may occur between any two devices (e.g., between two UEs, between a UE and an access point). Further, the mmW base station 410 may be an access point and/or a relay.

Figure 5:
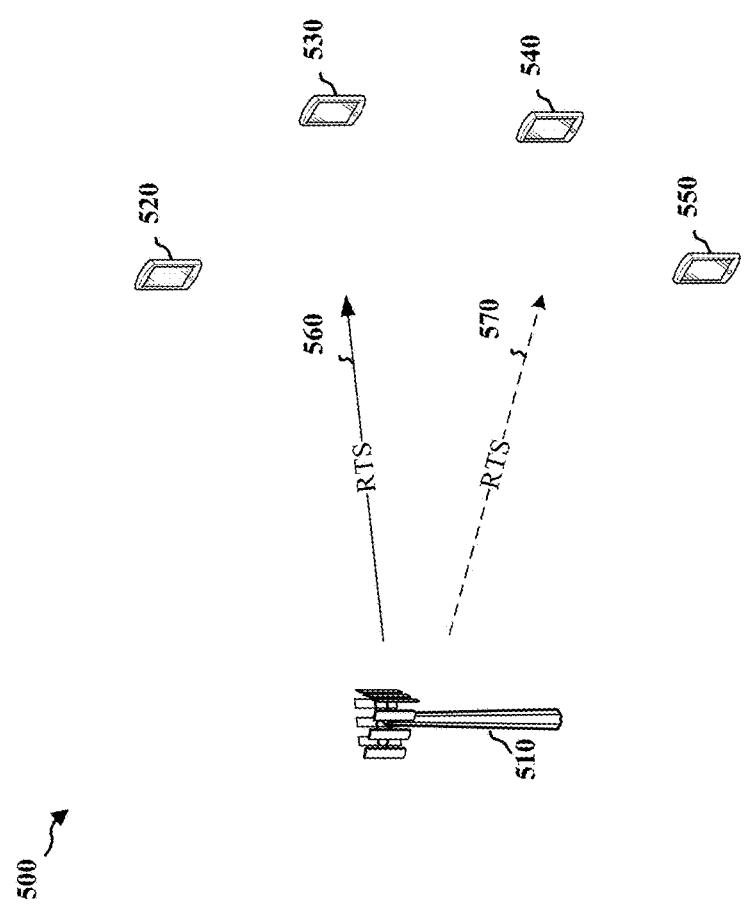
FIG. 5 illustrates a wireless communication system that supports devices using a contention based medium access scheme for wireless medium access, and signaling during downlink transmissions

FIG. 5 is a diagram 500 of a wireless communication system that supports devices using a contention based medium access scheme for gaining access to the wireless medium, e.g., a wireless frequency band/channel. The contention for medium access occurs in a CBAP as discussed above. FIG. 5 illustrates an example of a scenario of CBAP use for downlink transmissions. The wireless communication system may be compatible with the IEEE 802.11ad standard and/or other standards. Referring to FIG. 5, a base station 510 may transmit an RTS message to one of the UEs 520, 530, 540, 550. For example, the base station 510 may transmit a first RTS message 560 to the UE 530. Although the base station 510 may know which direction the base station 510 intends to transmit the first RTS message 560, the UE 530 may receive transmissions using a omni-directional beam, since the UE 530 may not know which wireless device (e.g., the base station 510 or other UEs) will transmit an RTS. Upon receiving the first RTS message 560, the UE 530 may estimate the interference at the UE 530 and/or determine channel conditions. If the medium is busy, or the estimated interference at the UE 530 is high (e.g., due to signal transmissions heard from other devices and/or the UE 530 may overestimate the interference), the UE 530 may not respond with a CTS message to the base station 510. If the base station 510 does not receive the CTS message from the UE 530, then the base station 510 may send a second RTS message 570 to another UE, e.g., UE 540. Each round of RTS and CTS messages may lead to increased network overhead.

Figure 6:
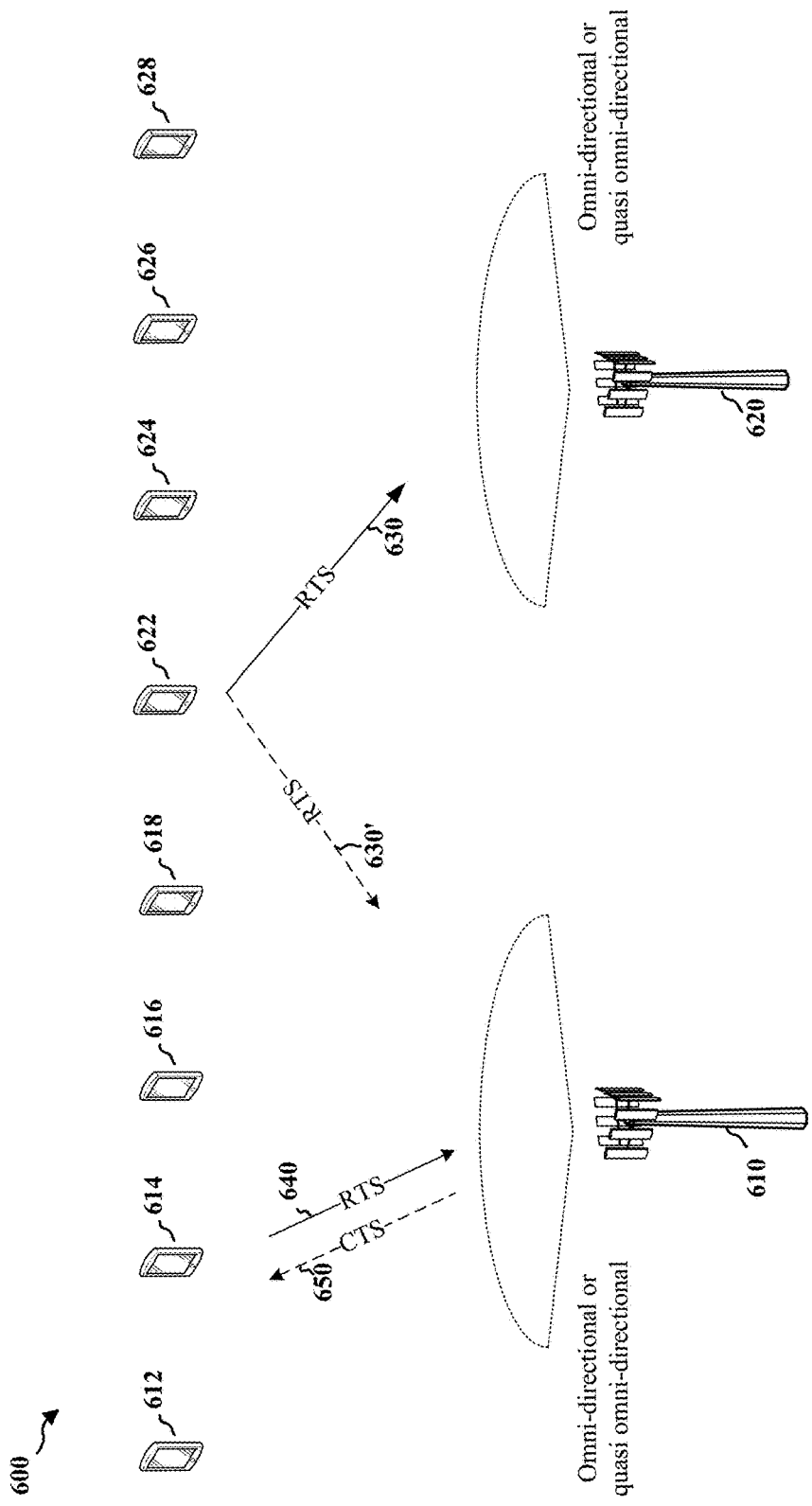
FIG. 6 is a diagram of a wireless communication system using an uplink contention based access period for uplink transmissions.

FIG. 6 is a diagram 600 of a wireless communication system using an uplink contention based access period. In some embodiments the wireless communication system is compatible with the IEEE 802.11ad standard and may also be compatible with other standards. Referring to FIG. 6, a first base station 610 may be associated with UEs 612, 614, 616, 618. A second base station 620 may be associated with UEs 622, 624, 626, 628. The first and second base stations 610, 620 may operate in an omni-directional mode or quasi omni-directional mode with respect to receiving signals, such as RTS signals, from UEs during a contention based access period. The operation in omni-directional mode or quasi omni-directional mode for reception purposes may be due to the first and second base stations 610, 620 not knowing which UEs are going to transmit, and thus the base stations operate in the omni-directional mode or quasi omni-directional reception mode to be able to receive signals from multiple directions in omni or quasi omni-directional manner. During this period, many UEs may be attempting to transmit RTS messages to a base station (or another receiver) and the number of antennas at each UE may be smaller than the number of antennas at the base station.

In the illustrated example, UE 614 transmits an RTS message 640 to the first base station 610. On the other hand, UE 622 may also transmit an RTS message 630 to the second base station 620. In an aspect, the UE 622 may be sufficiently close to the first base station 610. Because the first base station 610 may be receiving in an omni-directional manner, the RTS message 630 may be received as interference (shown as RTS message 630') at the first base station 610. Without further coordination of RTS transmissions, the UE 622 may cause interference at the first base station 610 during the RTS transmission of the UE 614. In some cases if the estimated interference at the base station 610, e.g., estimated as an interference to noise ratio, exceeds a threshold (e.g., 3 dB), then the first base station 610 may not transmit a CTS message 650 to the UE 614 based on the estimated interference (RTS message 630') caused by the transmission of RTS message 630 from UE 622. If the CTS message 650 from the first base station 610, is not received at the UE 614, the UE 614 may not obtain access to the medium and thus may try again to gain access to the medium by sending RTS in another round of RTS/CTS exchanges leading to additional overhead. Other UEs associated with the first base station 610 may experience similar problems, which may increase RTS/CTS overhead. Likewise, UEs associated with the second base station 620 may also experience similar problems, e.g., when RTS transmissions from UEs associated with the first base station 610 cause interference at the second base station 620 and thereby discourage the second base station 620 from transmitting a CTS back to a transmitter which transmitted an RTS and is waiting to hear back CTS from the second base station 620. Thus, many such affected transmitters which fail to receive a CTS in response to a RTS may attempt to send RTS again which may increase the RTS/CTS overhead.

Figure 7:
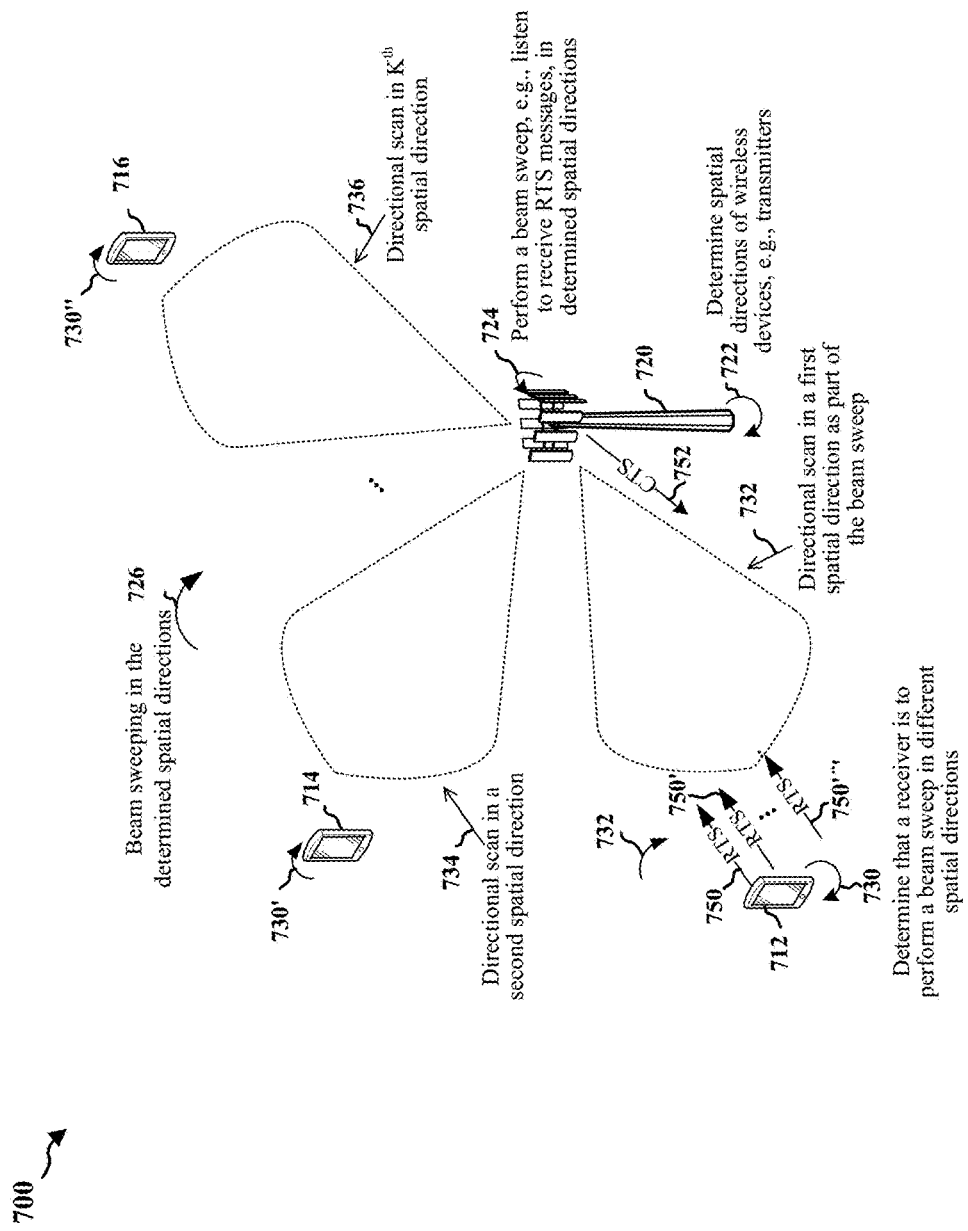
FIG. 7 illustrates exemplary processing and message exchange between devices in an exemplary wireless communication system where multiple transmission and directional reception of RTS may be implemented in accordance with an exemplary embodiment.

FIG. 7 is a drawing 700 illustrating processing and message exchange between devices in an exemplary wireless communication system where multiple transmission and directional reception of RTS may be implemented, in accordance with aspects of various embodiments. The wireless communication system may be compatible with the IEEE 802.11ad standard and/or other standards. The wireless communication system may be well suited for operations in both licensed and unlicensed frequency bands. Referring to FIG. 7, a receiving device, such as base station 720, may be serving and/or otherwise associated with a plurality UEs 712, 714, . . . , 716. The UEs may be located in various different spatial directions with respect to the base station 720 as illustrated in FIG. 7. In accordance with one aspect, the base station 720 may be capable of operating in an omni-directional mode or in a directional mode, e.g., for performing a beam sweep, for receiving signals, e.g., such as RTS messages from UEs located in various different spatial directions during a contention based access period and/or other messages during other periods during which the base station 720 may receive signals.

Since the UEs 712, 714, . . . , 716 are associated, or otherwise connected to the base station 720, the base station 720 may know the number of UEs that may transmit an RTS message to the base station 720. Accordingly, the base station 720 may perform beam training, as described in FIG. 4, with each the UEs 712, 714, . . . , 716 and determine the spatial directions of the potential transmitters. In some configurations, the base station 720 may determine the spatial directions in which various UEs may transmit based on information/signaling exchanged between the base station 720 and UEs earlier, e.g., information received during a beamforming training interval (such as the beamforming training interval 464) and/or an announcement transmission interval (such as the announcement transmission interval 466).

The operation of determining the spatial directions of various potential transmitters is represented by curved arrow 722 in drawing 700. Determining the spatial directions of the potential transmitters may allow the base station 720 to limit scanning for RTS and/or other messages to the determined spatial directions, e.g., by performing a beam sweep in the determined spatial directions for receiving RTS/CTS messages where transmitters will likely transmit, rather than scanning for RTS/CTS messages in an omni-directional manner. The base station may determine, for example, K different spatial directions corresponding to potential transmitters in which the beam sweep may be performed. Through beam training, the base station 720 may determine optimal or preferred spatial direction for each of the UEs 712, 714, . . . , 716, e.g., directions in which the UEs 712, 714, . . . , 716 may transmit. After determining the spatial directions, the base station 720 may select a sweeping pattern for each UE based on the optimal spatial directions for each UE. For example, the UE 712 may have 4 antennas of which 3 antennas may be used for transmission to 3 corresponding antennas at the base station 720. Based on the determined spatial directions, the base station 720 may select a sweeping pattern corresponding to one or more angular sectors or regions for receiving RTS signals transmitted by the UE 712. Drawing 700 also illustrates the base station 720 performing a beam a sweep as represented by curved arrow 724. A beam sweep performed by the base station 720 in the various determined spatial directions is indicated by curved arrow 726 and includes directional scanning/listening (732, 734, . . . , 736) in the determined spatial directions.

Performing a beam sweep in the determined spatial directions may include the base station 720 listening for messages, e.g., an RTS message, in each of the determined spatial directions. Thus by performing a beam sweep, the base station scans each of the determined K spatial directions in which the potential transmitters may transmit. That is, the base station 720 may listen for RTS messages from the transmitters in each of the determined K spatial directions during the beam sweep duration. For example, if a first transmitter, e.g., UE 712, is in a first spatial direction with respect to the base station 720, the base station 720 may perform, as part of the beam sweep, a directional scan in the first spatial direction (arrow 732) to detect RTS messages from transmitters (e.g., UE 712) transmitting in the first spatial direction. In this example, the first spatial direction may be the preferred transmission direction of the UE 712. The directional scan in the first spatial direction as part of the beam sweep may be performed over an angular range to listen for messages from the UE 712. Similarly, as part of the beam sweep, the base station 720 may next perform a directional scan in a second spatial direction (arrow 734) for listening for RTS messages from transmitters (e.g., UE 714) in the second spatial direction and may continue performing, as part of the beam sweep, directional scans in each of the determined spatial directions until finally performing a directional scan in the determined $K^{th}$ spatial direction (arrow 736) for listening for RTS messages from transmitters (e.g., UE 716) in the $K^{th}$ spatial direction. As discussed below, the base station 720 may receive one or more RTS messages from the transmitters in the one or more determined spatial directions while performing the beam sweep in the determined spatial directions during the beam sweep duration.

While a beam sweep may be performed by the base station 720 in the determined spatial directions, the transmitters in the corresponding spatial directions may or may not transmit an RTS message, e.g., depending on each transmitter's desire to transmit data. Furthermore in accordance with one aspect, the UEs 712, 714, . . . , 716 may not, and in some embodiments do not know the beam sweep pattern which the base station 720 performs the directional scans and/or the time slots in which the base station 720 performs directional scans (as part of the beam sweep) in the spatial directions corresponding to the UEs 712, 714, . . . , 716. However, in accordance with an aspect, the transmitting devices (e.g., UEs 712, 714, . . . , 716) may determine that the base station 720 performs a beam sweep in K different spatial directions. This determination at the UEs is represented in drawing 700 by curved arrows 730, 730', 730".

In the illustration of drawing 700, consider that UE 712 has data to transmit to the base station 720 and may decide to transmit an RTS message 750 to the base station 720. While the UE 712 does not know exactly when the base station 720 performs a sweep, e.g., directional scan, in the first spatial direction, the UE 712 (and other UEs associated with the base station 720) do know that base station 720 performs a beam sweep in K different spatial directions including the first spatial direction. For example, in some configurations, the information indicating that the that base station 720 will perform a beam sweep in K different spatial directions and the duration of the beam sweep is communicated by the base station 720 in a message to the UEs 712, 714, . . . , 716, e.g., during an earlier interval of information exchange. Accordingly, in accordance with one aspect, the UE 712 transmits the same RTS message 750 for a data transmission K times in the same direction during a duration of the beam sweep. The duration of the beam sweep includes a time period in which the base station 720 completes the beam sweep in the K different spatial directions, e.g., by performing a directional scan in each of the K spatial directions. In some configurations, the RTS message 750 is transmitted K times consecutively in the same direction during the duration of the beam sweep. The time duration in which the beam sweep is performed by the base station corresponds to the CBAP and may be determined by the devices in the system, e.g., UEs 712, 714, . . . , 716, based on the information from the base station 720 indicating the duration of the beam sweep. For example, in one configuration the base station may inform the UEs 712, 714, . . . , 716, e.g., via a message communicated prior to initiating the beam sweep, to listen for RTS messages, that the base station 720 will perform a beam sweep in, e.g., 5 different spatial directions including the first spatial direction (e.g., direction of RTS transmission of the UE 712) and indicate the duration of the beam sweep is, e.g., 500 ms. Based on the information, the UE 712 that intends to transmit an RTS message may determine that the base station 720 will complete the sweep in all 5 directions in 500 ms and thus perform one directional scan, e.g., to listen for RTS messages in the direction of the directional scan, in 100 ms. Accordingly, the UE 712 may transmit the RTS message 5 times in the same spatial direction, e.g., in a beamformed manner.

While the same RTS message 750 is transmitted K times by the UE 712, in drawing 700 the first transmission of RTS message by UE 712 is represented as RTS message 750, the second transmission of the RTS message is represented as 750', . . . , and the Kth transmission of the RTS message is represented as 750'. It should be noted that not all of the K transmissions of the same RTS message (750, 750', . . . , 750') occur during a time interval (e.g., T1) when the base station 720 is scanning in the first spatial direction. However at least one of the K transmissions of RTS message 750 occurs during that time interval while other transmissions of RTS message 750 may be before or after duration T1 when the base station is not directionally scanning, e.g., listening, in the first spatial direction. The RTS message 750 may be transmitted directionally by the UE 712 by selecting one or more antennas to directionally transmit (e.g., in the first spatial direction) via beamforming to the base station 720. While illustrated in drawing 700 as being transmitted in a directional manner, in some other embodiments, some of the transmissions of the RTS message 750 among the K transmissions of RTS message 750 may be in an omni-directional manner.

During a time interval, e.g., T1, when the base station is performing a directional scan in the first spatial direction (to listen to the RTS transmissions in the first spatial direction), the base station 720 may receive at least one of the K transmissions of the RTS message 750 and may determine that an RTS message for a data transmission is received from a first transmitter (e.g., UE 712) at the first spatial direction of the determined spatial directions. After receiving the RTS message 750, the base station 720 may assess the channel to evaluate whether the channel is available for data transmission. If the channel is busy or there is too much interference at the base station 720, the base station 720 may decide not transmit a CTS message in response to the RTS message. Assuming the channel is free and/or the estimated interference is below a threshold, the base station 720 may determine to transmit a CTS message 752 to the UE 712. In one aspect, the base station 720 may transmit the CTS message 752 omni-directionally, and the CTS message 752 may be received not only by the UE 712, but also by nearby devices such as one or more of the UEs 714, . . . , 716. In another aspect, the base station 720 may transmit the CTS message 752 directionally via beamforming to the UE 712. In this aspect, the base station 720 may determine the first spatial direction in which the UE 712 transmitted the RTS message 750 and transmit the CTS message 752 in the same first spatial direction. The CTS message 752 may indicate that the UE 712 may begin the data transmission.

The RTS message 750 may include a duration field. In one configuration, the duration field may indicate the duration of the RTS message 750. In this configuration, the CTS message 752 may be transmitted after the expiration of a duration in the duration field of the RTS message 750. For example, the base station 720, upon receiving the RTS message 750, may set a network allocation vector (NAV) based on the duration field of the RTS message 750, and transmit the CTS message 752 after expiration of the NAV, e.g., after a NAV counter counts down to zero. In another configuration, the duration field in the RTS message 750 may indicate and reserve a time period after the RTS message 750 that includes a duration of CTS message 752, duration of a data message, duration of an acknowledgment message, and duration of any interframe space in between the messages. In this configuration, the CTS message 752 may be transmitted during and before the end of the duration indicated in the duration field of the RTS message 750. For example, the base station 720, upon receiving the RTS message 750, may set a NAV based on the duration field of the RTS message 750, e.g., according to an interval/duration, indicated within the duration field of the RTS message 750, for transmission of the CTS message by the receiver of RTS message 750. In such a configuration, the base station 720 may transmit the CTS message 752 prior to expiration of the NAV.

The CTS message 752 may include a duration field. In one configuration, the duration field in the CTS message 752 may indicate the duration of the CTS message 752. For example, in this configuration, the UE 712 may receive the CTS message 752 and set the NAV according to the duration of the CTS message 752. After the NAV expires (counts down to 0), then the UE 712 may transmit the data. Thus, in such a configuration the base station 720 may receive the data transmission based on the NAV sent in the CTS message 752. In another configuration, the duration field of CTS message 752 may indicate and reserve a time period after the CTS message 752 that includes a duration of a data message, duration of an acknowledgment message, and duration of any interframe space between the messages. For example, in this configuration, the UE 712 may receive the CTS message 752 and may not set the NAV according to the CTS message 752. The UE 712 may send the data transmission before the expiration of the time period indicated in the duration field of the CTS message 752.

As previously discussed, the base station 720 may transmit the CTS message 752 directionally to the intended device (e.g., the UE 712) or omni-directionally so that other UEs may hear and determine that a CTS has been transmitted. In some embodiments, the base station 720 may transmit information indicating that the CTS message 752 has been transmitted to the UE 712, to at least one other transmitter, e.g., to UEs 714, . . . , 716. In some embodiments, the information indicating that the CTS message 752 is transmitted directionally, e.g., in a beamformed manner, may be sent to each transmitter of the at least one other transmitter in each of the determined spatial directions other than the first spatial direction. Thus, in configurations where the information is transmitted directionally to other UEs, the information is sent via a beamformed transmission in each spatial direction of the other UEs 714, . . . , 716 but is not transmitted in the first spatial direction corresponding to the UE 712. In some embodiments, the information indicates the duration for which the medium will be busy, e.g., for data transmission from UE 712, acknowledgment (ACK) and any additional frame spacing duration.

When the UEs 714, . . . , 716 receive either the CTS message 752, or the information indicating that the CTS message 752 has been transmitted, the UEs 714, . . . , 716 may determine that the medium is currently being used and/or will be in use for the duration indicated by the CTS message 752 and/or the information. The UEs 714, . . . , 716 may each set the NAV based on the duration field and may not attempt to transmit an RTS message until the medium is available (e.g., when NAV is equal to 0), which reduces interference and RTS/CTS overhead. On the other hand, upon receiving the CTS message 752, the UE 712 may transmit the data to the base station 720. After receiving the data, the base station 720 may transmit an acknowledgment message to the UE 712.

It should be appreciated that since the UE 712 transmitted the KRTS messages (RTS message 750, RTS message 750', . . . , RTS message 750') in the same direction to the base station 720, rather than transmitting omni-directionally or in different directions during different time periods, the UE 712 may cause less interference at neighboring base stations which may be listening for RTS transmissions from various transmitters. A neighboring base station may have a better chance of successfully receiving an RTS message and responding with a CTS to the transmitter. Thus, additional rounds of RTS/CTS messages may be reduced thereby increasing medium reuse as compared to the scenario described in FIG. 6.

Figure 8:
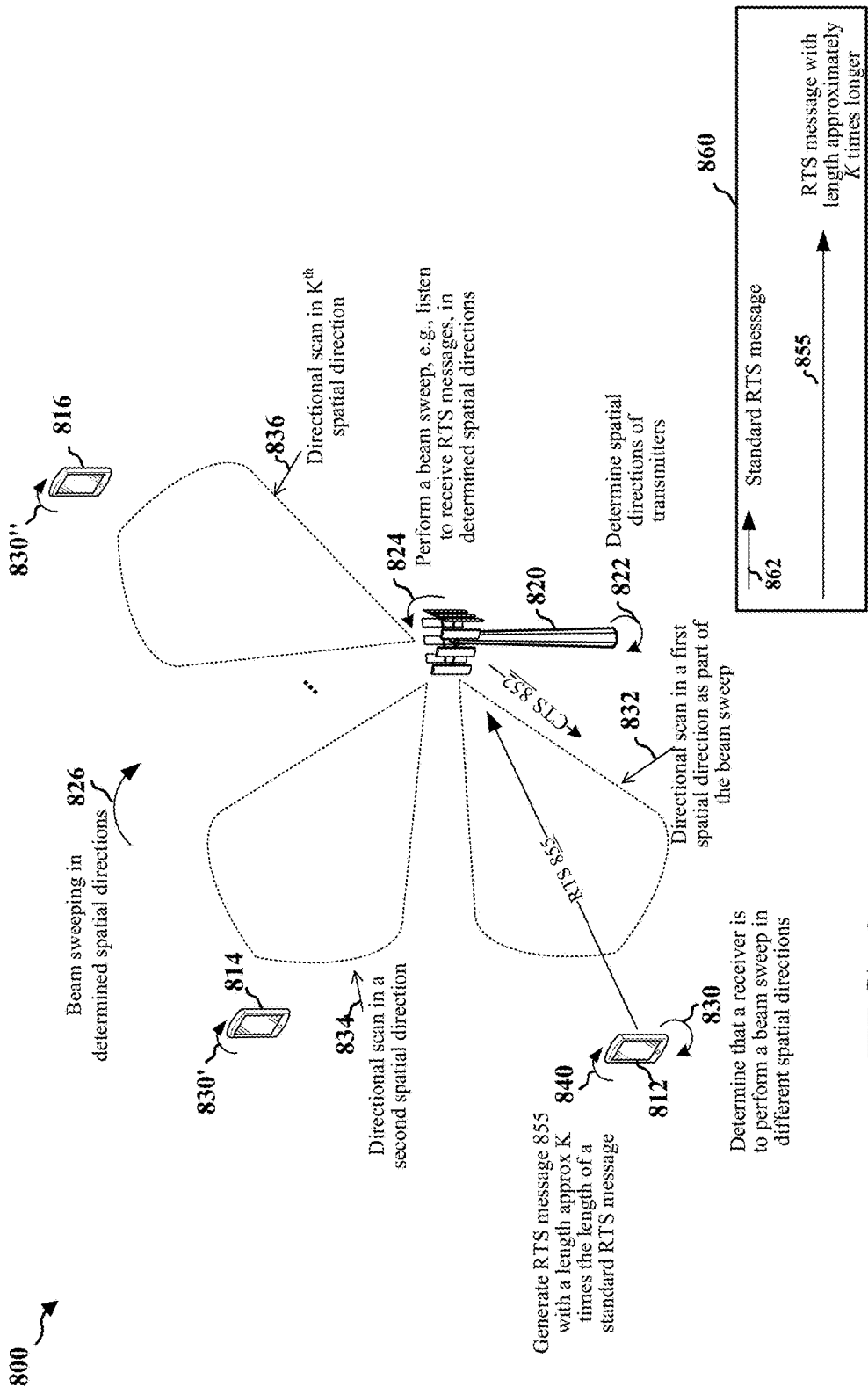
FIG. 8 illustrates another exemplary processing and message exchange between devices in an exemplary wireless communication system in accordance with another embodiment.

FIG. 8 is a drawing 800 illustrating processing and message exchange between devices in an exemplary wireless communication system where an alternative scheme for transmission of RTS and directional reception of RTS may be implemented, in accordance with another aspect. The wireless communication system of drawing 800 as well as the devices operating therein may be the same or similar to the system and devices shown in drawing 700 of FIG. 7 and in the same manner may be compatible with the IEEE 802.11ad standard and/or other standards. The wireless communication system including the devices may be well suited for operations in both licensed and unlicensed frequency bands. Accordingly, the corresponding devices, signaling, messages and processing in drawing 800 are represented using the same reference numbers as in drawing 700 but with the initial number beginning with an "8" instead of the number "7". Thus, the operation and functioning of the base station 820 may be the same or similar to the base station 720, the functioning of UEs 812, 814, . . . , 816 associated with the base station 820 may be the same or similar to the functioning of UEs 712, 814, . . . , 716, with the exception that in the embodiment of FIG. 8, multiple transmissions of RTS messages in not performed by the UEs. Rather in accordance with another aspect, one or more transmitters in FIG. 8 configuration, which desire to transmit data, may generate an RTS message with a length approximately K times longer than a standard RTS message and may transmit the generated RTS having the length K times longer. It should be appreciated that while the term length is used, the length of the RTS message does not represent a physical length/range of the RTS message in terms of reach, but rather a duration.

The processing/operations associated with the curved arrows 822, 824, 826, 830, 830', 830" of FIG. 8 may be the same or similar to the processing discussed above with regard to curved arrows 722, 724, 726, 730, 730', 730" of FIG. 7, and thus the same or similar functioning and processing associated with the devices will not be discussed in detail again for the sake of brevity. Similarly, the discussion relating to the beam sweep in different determined spatial directions (indicated by arrows 732, 734 and 736) performed by the base station 720 discussed in FIG. 7 equally applies to FIG. 8 configuration and is illustrated by arrows 832, 834 and 836. However, the aspects illustrated in FIG. 8 configuration which are different than those discussed with regard to FIG. 7, are discussed below in greater detail.

In FIG. 8 configuration, an alternative scheme to the K multiple RTS message transmissions illustrated in FIG. 7, is implemented. In FIG. 8 configuration, the transmitting devices which have data to be transmitted, may transmit an RTS message with a length, e.g., duration, approximately K times longer than a standard RTS message. The UEs, as illustrated in FIG. 8, may be in various different spatial directions with respect to the base station 820. In the same or similar manner as discussed above with regard to the base station 720 of FIG. 7, the base station 820 may determine (830) spatial directions of a plurality of transmitters including a first transmitter (e.g., UE 812) and at least one other transmitter (e.g., UEs 814, . . . , 816). The determination may be performed, e.g., based on the information/signaling exchange between the base station 820 and UEs 812, 814, . . . , 816 during a beamforming training phase (e.g., during the association beamforming training interval 464) and/or an announcement transmission phase (e.g., during the announcement transmission interval 466) as discussed earlier. In some configurations, based on the determined spatial directions, the base station 820 may perform a beam sweep in at least one determined spatial direction for receiving one or more RTS messages. In some configurations, performing a beam sweep in the at least one determined spatial direction includes the base station 820 listening for messages, e.g., an RTS message, in the at least one determined spatial direction. In some configurations, performing the beam sweep includes performing directional scanning, e.g., listening for RTS messages from transmitting UEs, in each of the determined spatial directions as illustrated by 832, 834, . . . , 836.

With reference to FIG. 8, consider that UE 812 has data to transmit to the base station 820 and may decide to transmit an RTS message 855 for data transmission to the base station 820. Similar to what is discussed above with respect to FIG. 7, while the UE 812 does not know exactly when the base station 820 is to perform a directional scan to listen for transmissions in the first spatial direction, the UE 812 knows that base station 720 will perform a beam sweep in K different spatial directions including the first spatial direction and also knows a duration of the beam sweep. Accordingly, since the UE 812 knows that base station 820 will perform a beam sweep in K different spatial directions including the first spatial direction, in accordance with one aspect the UE 812 may generate a RTS message 855 with a length approximately K times longer than a standard RTS message (curved arrow 840) and transmit the generated RTS message 855 during a duration of the beam sweep. Thus, even though the base station 820 may be listening/scanning in K different spatial directions at different times, the base station 820 will listen for RTS messages in the direction of the UE 812 at least once during the duration of the beam sweep and since the RTS message 855 is K times longer (e.g., transmitted for a duration K times longer than the duration of a standard RTS), the RTS message 855 will be detected by the base station 820 during the beam sweep.

To illustrate that the generated RTS message 855 is approximately K times longer, e.g., in duration, than a standard RTS message, the arrow representing the RTS message 855 is shown to be longer than the arrow used in FIG. 7 configuration to represent RTS message 750 which may be a standard RTS message in terms of length/duration in some embodiments. Again for conceptual illustration and to facilitate an understanding of the concept, box 860 shows two RTS messages, the first one being shown as a standard RTS message 862 and the second one being the RTS message 855 which is represented by a much longer arrow indicates an exemplary RTS message with a length K times longer than the standard RTS message. However, the length of arrow used to represent RTS message 855 does not indicate a physically reachable distance and/or distance covered by the RTS message 855.

The RTS message 855 may be transmitted directionally by the UE 812 by selecting one or more antennas to directionally transmit via beamforming to the base station 820. While illustrated in drawing 800 as being transmitted in a directional manner, in some other embodiments the transmission of the RTS message 855 may be in an omnidirectional manner.

During a time interval when the base station is performing a first directional scan, as part of the beam sweep, in the first spatial direction, the base station 820 may detect and receive the RTS message 855 and may determine that an RTS message for a data transmission is received from a first transmitter (e.g., UE 812) at the first spatial direction of the determined spatial directions. After receiving the RTS message 855, the base station 820 may assess the channel in the similar manner as discussed with regard to FIG. 7. Assuming the channel is free and/or the estimated interference is below a threshold, the base station 820 may determine to transmit a CTS message 852 to the UE 812. In one aspect, the base station 820 may transmit the CTS message 852 omni-directionally, and the CTS message 852 may be received not only by the UE 812, but also by nearby devices such as one or more of the UEs 814, . . . , 816. In another aspect, the base station 820 may transmit the CTS message 852 directionally via beamforming. In this aspect, the base station 820 may determine the first spatial direction in which the UE 812 transmitted the RTS message 855 and transmit the CTS message 852 in the same first spatial direction. The CTS message 852 may indicate that the UE 812 may begin the data transmission.

The RTS message 855 may include a duration field. In one configuration, the duration field may indicate the duration of the RTS message 855. In this configuration, the CTS message 852 may be transmitted after the expiration of a duration indicated in the duration field of the RTS message 855. For example, the base station 820, upon receiving the RTS message 855, may set a NAV based on the duration field of the RTS message 855, and transmit the CTS message 852 after expiration of the NAV, e.g., after NAV counts down to zero. In another configuration, the duration field in the RTS message 855 may indicate and reserve a time period after the RTS message 855 that includes a duration of CTS message 852, a data message, an acknowledgment message, and any interframe space in between messages. In this configuration, the CTS message 852 may be transmitted during and before the end of the duration indicated in the duration field of the RTS message 855. For example, the base station 820, upon receiving the RTS message 855, may set a NAV based on the duration field of the RTS message 855, e.g., according to an interval/duration, indicated within the duration field of the RTS message 855, for transmission of the CTS message by the receiver of RTS message 855. In such a configuration the base station 820 may transmit the CTS message 852 prior to expiration of the NAV.

The CTS message 852 may include a duration field. In one configuration, the duration field in the CTS message 852 may indicate the duration of the CTS message 852. For example, in this configuration, the UE 812 may receive the CTS message 852 and set the NAV according to the duration of the CTS message 852. After the NAV expires (counts down to 0), then the UE 812 may transmit the data. Thus in such a configuration the base station 820 may receive the data transmission based on the NAV sent in the CTS message 852. In another configuration, the duration field of CTS message 852 may indicate and reserve a time period after the CTS message 852 that includes a duration of a data message, an acknowledgment message, and any interframe space in between messages. For example, in this configuration, the UE 812 may receive the CTS message 852 and may not set the NAV according to the CTS message 852. The UE 812 may send the data transmission before the expiration of the time period indicated in the duration field of the CTS message 852.

As previously discussed, the base station 820 may transmit the CTS message 852 directionally to intended device (e.g., the UE 812) or omni-directionally so that other UEs hear that a CTS has been transmitted. In some embodiments, the base station 820 may transmit information indicating that the CTS message 852 has been transmitted to the UE 812, to at least one other transmitter, e.g., to one or more of the UEs 814, . . . , 816. In some embodiments, the information indicating that the CTS message 852 has been is transmitted directionally, e.g., in a beamformed manner, to each transmitter of the at least one other transmitter in each of the determined spatial directions other than the first spatial direction. Thus in configurations where the information is transmitted directionally to other UEs, the information is beamformed in the spatial direction of the other UEs 814, . . . , 816 but is not transmitted in the first spatial direction corresponding to the UE 812. In some embodiments the information indicates the duration for which the medium will be busy, e.g., for data transmission from UE 812, acknowledgment (ACK) and any additional frame spacing duration.

When the UEs 814, . . . , 816 receive either the CTS message 852 or the information indicating that the CTS message 852 has been transmitted, the UEs 814, . . . , 816 will determine that the medium is currently being used and/or will be in use for the duration indicated by the CTS 852 and/or the information. The UEs 814, . . . , 816 may each set the NAV based on the duration field and may not attempt to transmit an RTS message until the medium is available (e.g., when NAV is equal to 0), which reduces interference and RTS/CTS overhead. Upon receiving the CTS message 852, the UE 812 may transmit the data to the base station 820. After receiving the data, the base station 820 may transmit an acknowledgment message to the UE 812.

It should be appreciated that since the UE 812 transmitted the RTS message 855 directionally to the base station 820, the UE 812 does not cause interference at neighboring base stations which may be listening for RTS transmissions from other UEs. A neighboring base station may have a better chance of successfully receiving RTS messages and responding with a CTS to the transmitter. Thus additional rounds of RTS/CTS may be reduced thereby increasing and improving medium reuse as compared to the scenario described in FIG. 6.

In the aforementioned examples, the base station 720/820 functioned as a receiver device, directionally receiving the RTS message 750/855, and the UE 712/812 functioned as a transmitter device, transmitting the RTS message 750/855. However, any device may function as the receiver device and/or the transmitter device. For example, a base station, an access point, a relay, a UE, or a CPE may be a transmitter device. Similarly, a base station, an access point, a relay, a UE, or a CPE may be a receiver device. Accordingly, the methods, features, principles, and techniques described herein may be applicable to different types of devices and different configurations. A CPE may be, e.g., a cellular phone, a smart phone, a set top box (STB), a personal computer, a laptop, a tablet device another similar functioning device.

Figure 9:
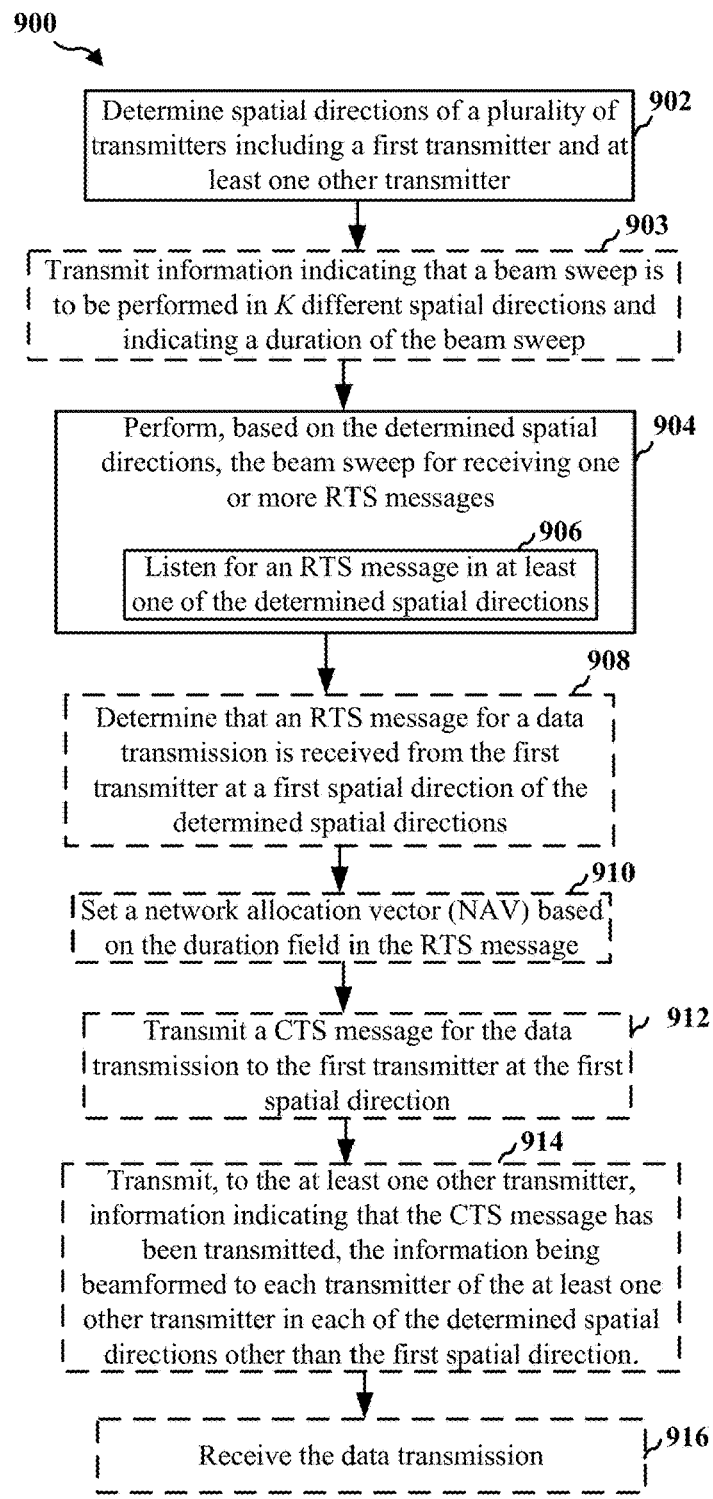
FIG. 9 is a flowchart of an exemplary method of wireless communication of a receiver.

FIG. 9 is a flowchart 900 of a method of wireless communication. The method may be performed by an apparatus (e.g., a base station such as base station 720/820, the UE 712, the apparatus 1002/1002'). In some configurations, the apparatus is a receiver, e.g., a base station/AP. In one embodiment, the apparatus may be a network node such as a base station or a relay and not a mobile device such as a UE. At 902, the apparatus may determine spatial directions of a number of wireless devices, e.g., transmitters, including a first transmitter and at least one other transmitter. For example, referring to FIGS. 7-8, the apparatus may be the base station 720 or 820. The base station may determine spatial directions of a number of UEs including UE 712 (e.g., the first transmitter) and UEs 714, . . . , 716 (at least one other transmitter). The spatial direction of a transmitter may indicate the direction of transmission of the transmitter, e.g., in which the transmitter transmits messages/signaling to a receiver, e.g., base station 720. For example, the base station 720/820 may determine the spatial directions of transmitters by performing beam training during the association beamforming training. For instance, the UE 712 may transmit beacons from each of its antennas, the base station 720 may receive the beacons and determine which antenna(s) provides the best quality signal at the base station 720 (e.g., highest SNR or SINR). The base station 720 may transmit the information to the UE 712 indicating the best antenna(s) at the UE 712 and the devices may agree that transmission direction corresponding to the indicated antenna(s) may be the preferred transmission direction for the UE 712 to transmit messages to the base station. Subsequently the UE may transmit messages to the base station 720 using the indicated antenna(s) in a directional manner. While beam training may be used to determine the spatial directions, it should be appreciated that the spatial directions of the potential transmitters may be determined in a variety of ways. For example, in some embodiments the spatial directions of the plurality of transmitters may be determined based on direction and/or location information obtained by the apparatus from the transmitters in the system and/or other network devices such as a location and/or direction server. In another case, one or more transmitters each maintain a log of the transmitter's own location and/or transmission direction with respect to the apparatus (e.g., base station 720/820) as well as the locations and/or directions of other transmitters with respect to the apparatus. In such a case the apparatus may obtain, e.g., receive, the spatial direction information from such devices. In some configurations, a spatial direction of a transmitter may be determined based on the direction of arrival of signals from the transmitter. In some configurations, the apparatus may determine the spatial directions of the transmitters at least one of a beacon transmission interval or association beamforming training interval of a beacon interval, e.g., such as the intervals 462 and 464 of the beacon interval 460.

At 903, the apparatus may transmit information indicating that the apparatus is to perform a beam sweep in the determined spatial directions of the transmitters, e.g., in K different spatial directions, and indicating a duration of the beam sweep. For example, based on the determined spatial directions of transmitters, the apparatus may decide that a beam sweep in K different spatial direction should be performed. Thereafter, the apparatus may transmit a message, e.g., to at least one transmitter of the plurality of transmitters, indicating that the apparatus will perform a beam sweep in the K spatial directions and further indicating a duration of the beam sweep, e.g., to allow the transmitters to know that the apparatus will be listening/scanning in different directions during the indicated duration so that the transmitters may transmit RTS and/or other messages. In some configurations, the apparatus transmits such information during an announcement transmission interval, e.g., such as the interval 466 of the beacon interval 460.

At 904, the apparatus may perform, based on the determined spatial directions, a beam sweep for receiving one or more RTS messages, e.g., in the manner discussed in detail above with respect the base station 720/820. The beam sweep is performed in a contention time period, e.g., corresponding to CBAP 468 and/or CBAP 474. In some configurations, multiple beam sweeps may be performed during a CBAP. For example, for a CBAP of 5 seconds, if the duration of a single beam sweep (covering K spatial directional scans) is set to 500 ms, then approximately 10 or less beam sweeps may be performed in the CBAP. At 906 which is part of 904 in some configurations, the apparatus listens/scans for an RTS message in at least one of the determined spatial directions. In some embodiments the apparatus listens/scans for an RTS message in each of the determined spatial directions. For example, referring to FIG. 7, the base station 820 may perform a beam sweep in the K spatial directions for receiving one or more RTS messages from the UEs in the determined spatial directions. As discussed with respect to FIGS. 7-8, the beam sweep may include directional scanning in each of the K directions. The beam sweeping may be performed in some embodiments for a time period that allows the apparatus to scan/listen for RTS messages in each of the determined spatial directions. Thus, for example, if a beam sweep is performed in K determined spatial directions, a duration of the beam sweep may include a time period in which K directional scans are performed, e.g., to listen to RTS transmissions in the in K determined spatial directions. The base station 720 may also assign different weights to each on the antennas at the base station 720 based on the determined spatial directions and the sweep pattern. While performing the beam sweep in a spatial direction the apparatus may receive an RTS message form a transmitter.

At 908, the apparatus determines that an RTS message for a data transmission is received from the first transmitter (e.g., UE 712) at a first spatial direction of the determined spatial directions. For example, referring to FIG. 7, the base station 720 upon receiving the RTS message 750 may determine that the RTS message 750 for a data transmission is received from the UE 712 at the first spatial direction. The determination may be based on e.g., the transmitter address in the RTS message and the knowledge of the determined spatial directions of various transmitters (including the first transmitter, e.g., UE 712) which indicates the direction of transmission of the first transmitter and various other potential transmitters. Thus, upon receiving the RTS message from the first transmitter in the first spatial direction, the apparatus may determine that the received RTS message corresponds to the first transmitter. In some embodiments, based on the RTS message 750 received from the UE 712 at the first spatial direction, the apparatus may identify one or more antennas and/or weights to use at the base station 720 in order to transmit a CTS message, if decided, to the first transmitter. While reference to FIG. 7 is made for discussion relating to the base station 720 receiving the RTS message 750, it should be understood the apparatus may be the base station 820 of FIG. 8 and the RTS message discussed above may be the RTS message 855 of FIG. 8.

In some configurations the received RTS message includes a duration field. In some such configurations at 910 (optional), the apparatus may set a NAV based on the duration field in the RTS message. At 912, the apparatus may transmit a CTS message for the data transmission to the first transmitter in the first spatial direction. In an aspect, the CTS message may be transmitted in a beamformed manner in the first spatial direction or transmitted in an omni-directional manner. For example, referring to FIGS. 7-8, the base station 720/820 may transmit the CTS message 752/852 to the UE 712 in a beamformed manner in the first spatial direction. In some embodiments, the CTS message is beamformed to the first transmitter in the first spatial direction after expiration of the NAV. In one configuration, the apparatus may set a NAV based on the duration field of the received RTS message, and the CTS message 752/852 may be beamformed to the first transmitter after the NAV has expired. For example, the base station 720 may set the NAV based on the duration field of the RTS message 750/855, and transmit the CTS message 752/852 to the UE 712 after the NAV has expired.

At 914, the apparatus may transmit, to the at least one other transmitter, information indicating that the CTS message has been transmitted to at least one device, e.g., to the first transmitter. In some embodiments the apparatus transmits the information directionally, e.g., in a beamformed manner, to each transmitter of the at least one other transmitter in each of the determined spatial directions other than the first spatial direction. For example, referring to FIGS. 7-8, the base station 720/820 may directionally transmit the information indicating that the CTS message has been transmitted to at least one device to the UEs 714, . . . , 716 (or 814, . . . , 816 in FIG. 8 example) but not transmit this information in the first spatial direction since a CTS message 752 has been sent to UE 712. In some other embodiments, the information is transmitted in an omni-directional manner. In still some other embodiments, CTS message 752/852 may be transmitted in an omni-directional manner so that UE 712/812 as well as other UEs 714, . . . , 716 (or UEs 814, . . . , 816 of FIG. 8) also hear that a CTS message has been transmitted to UE 712/812. In this case, the information indicating that the CTS message has been transmitted to UE 712/812 is not transmitted to other UEs since the omni-directional transmission of the CTS message obviates the need to transmit this information.

Upon receiving the CTS message from the apparatus, the first transmitter may transmit the data to the apparatus. At 916, the apparatus may receive the data transmission from the first transmitter. In some configurations a NAV is sent in the CTS message. In some such configurations, the apparatus may receive the data transmission from the first transmitter based on the NAV sent in the CTS message. In an aspect, the NAV may indicate the duration of the CTS message.

Figure 10:
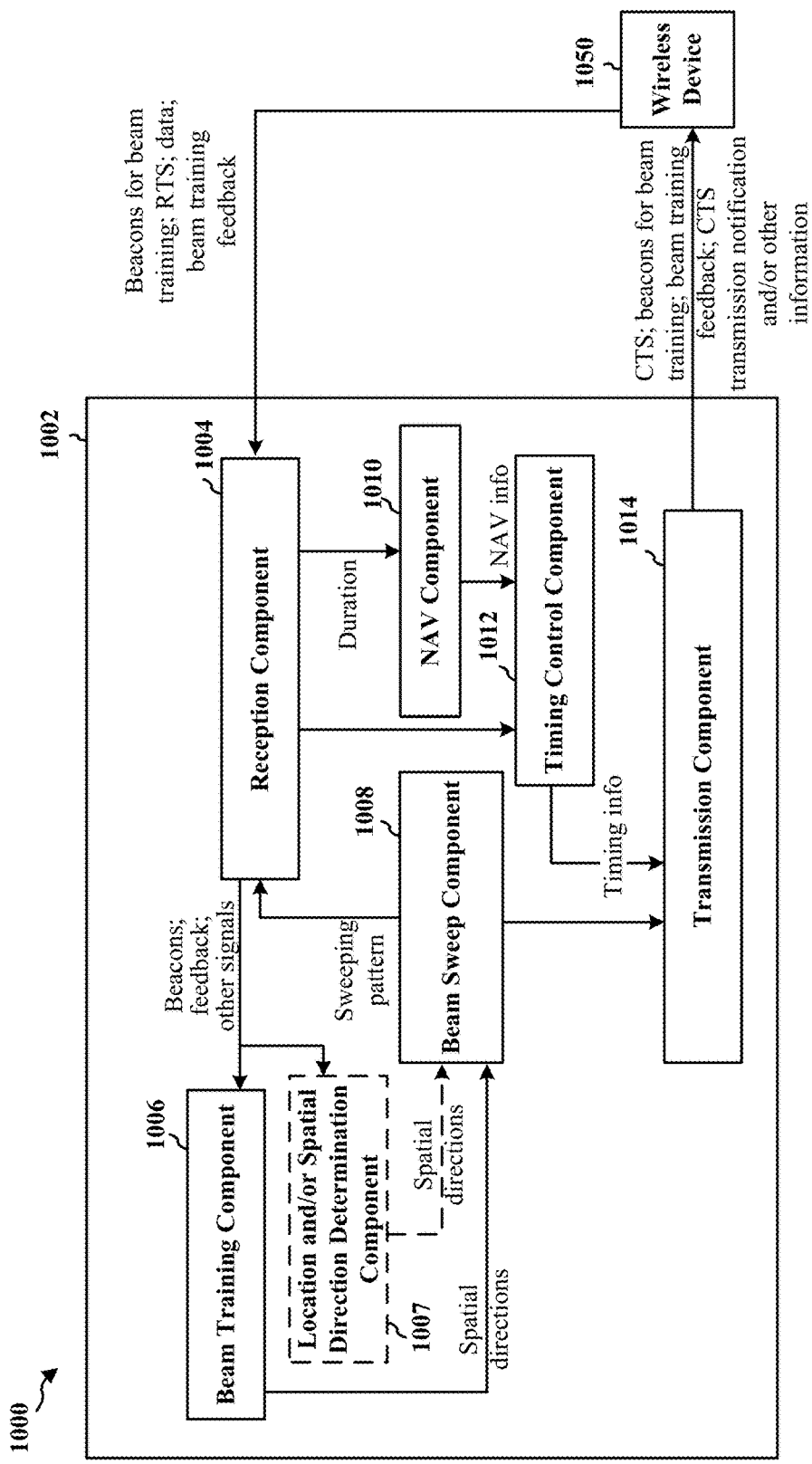
FIG. 10 is a conceptual data flow diagram illustrating the data flow between different means/components in an exemplary apparatus.

FIG. 10 is a conceptual data flow diagram 1000 illustrating the data flow between different means/components in an exemplary apparatus 1002. The apparatus may be a base station, a UE (e.g., such as base station 720/820 or the UE 712), or another device. For the purpose of discussion, we may consider that the apparatus 1002 may be the base station 720/820 shown in FIGS. 7-8. The apparatus 1002 may include a reception component 1004, a beam training component 1006, a location and/or spatial direction determination component 1007, a beam sweep component 1008, a NAV component 1010, a timing control component 1012, and a transmission component 1014.

The reception component 1004 may be configured to receive and process messages and/or other information from other devices such as a wireless device 1050. For example, with reference to FIG. 7, the apparatus 1002 may be the base station 720 and the reception component 1004 may receive beacons and/or beam training sequences, RTS, CTS and/or other signals/messages from one or more devices in the system, e.g., UEs 712, 714, . . . , 716. The wireless device 1050 may be, e.g., a transmitter such as the UE 712. The beam training component 1006 may be configured to determine spatial directions of a plurality of wireless devices, e.g., transmitters, which may transmit an RTS message to the apparatus. For example, the apparatus 1002 may be base station 720/820 and the plurality of wireless devices may be the transmitters that may potentially transmit RTS messages to the base station 720 such as UEs 712, 714, . . . , 716. In some configurations the plurality of transmitters may include a first transmitter, e.g., UE 712, and at least one other transmitter, e.g., one or more of the other UEs 714, . . . , 716. The beam training component 1006 may determine that spatial directions of the transmitters based on the knowledge of preferred transmission direction and/or preferred transmit antenna(s) corresponding to the transmitters acquired by the apparatus 1002 earlier, e.g., during a beamforming training interval.

The optional location and/or spatial direction determination component 1007 may be configured to determine locations and/or spatial directions of the plurality of devices, e.g., transmitters which may transmit to the apparatus 1002, based on received signals, location/direction of arrival data and/or other information from one or more devices which can be used for spatial direction determination purposes as discussed in more detail with regard to block 902. The beam sweep component 1008 may be configured to select a sweeping pattern based on the determined spatial directions. For example, based on the determined spatial directions of the transmitters, the beam sweep component 1008 may select a beam sweep pattern to allow the apparatus 1002 to perform a beam sweep to scan, e.g., listen for RTS messages, in the various determined spatial directions. In some configurations, the transmission component 1014 may be configured to transmit information indicating that the apparatus 1002 is to perform a beam sweep in the determined spatial directions of the transmitters, e.g., in K different spatial directions, and indicating a duration of the beam sweep.

The beam sweep component 1008 and/or the reception component 1004 alone or in combination may be configured to perform, based on the determined spatial directions, a beam sweep for receiving one or more RTS messages. The beam sweep component 1008 and/or the reception component 1004 may be configured to perform the beam sweep by listening/scanning for an RTS message in at least one of the K determined spatial directions. In some embodiment the beam sweep component 1008 and/or the reception component 1004 may be configured to perform the beam sweep by listening/scanning for an RTS message in each of the K determined spatial directions. In one configuration, the reception component 1004 and/or the beam training component 1006 may be configured to determine that the RTS message for a data transmission is received from the first transmitter at a first spatial direction of the determined spatial directions. For example, having determined the spatial directions of various transmitters (including the first transmitter), the beam training component 1006 knows the direction of transmission of the first transmitter and may provide such information to the reception component 1004, e.g., indicating that RTS message transmission from the first spatial direction correspond to the first transmitter. Thus, in some configurations, based on the information obtained from the beam training component 1006 (and/or from the spatial direction determination component 1007), upon receiving the RTS message the reception component 1004 may determine that the RTS message is received from the first transmitter in the first spatial direction of the determined spatial directions. In some such configuration, the transmission component 1014 may be configured to transmit a CTS message for the data transmission to the first transmitter in the first spatial direction. In an aspect, the CTS message may be transmitted in a beamformed manner in the first spatial direction. In another aspect, the CTS is transmitted in an omni-directional manner. In some configurations, the transmission component 1014 may be configured to transmit, to the at least one other transmitter, information indicating that the CTS message has been transmitted to the first transmitter. The information may be beamformed to each transmitter, of the at least one other transmitter in each of the determined spatial directions other than the first spatial direction. In some configurations, the RTS message may include a duration field, and the NAV component 1010 may be configured to set a NAV based on the duration field in the RTS message. In this configuration, the CTS message may be beamformed to the first transmitter after the NAV has expired. The timing control component 1012 may be configured to provide transmission timing information to the transmission component to control transmission of the CTS message, e.g., to the first transmitter, and/or other information to one or more devices.

In some embodiments the NAV component 1010 may be further configured to set a NAV and include the NAV in the CTS message. In some such configurations, a NAV may be transmitted in the CTS message via beamforming, and the reception component 1004 may be configured to receive the data transmission from the first transmitter based on the NAV included with the CTS message. In another aspect, the NAV may indicate the duration of the CTS message. In some configurations the apparatus may be one of a base station, an access point, a relay, a UE, or a CPE. In some embodiments the first transmitter and the at least one other transmitter may be one of a UE, a CPE, a base station, an access point or a relay.

The apparatus may include additional components that perform each of the blocks of the algorithm in the aforementioned flowcharts of FIG. 9. As such, each block in the aforementioned flowcharts of FIG. 9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 11:
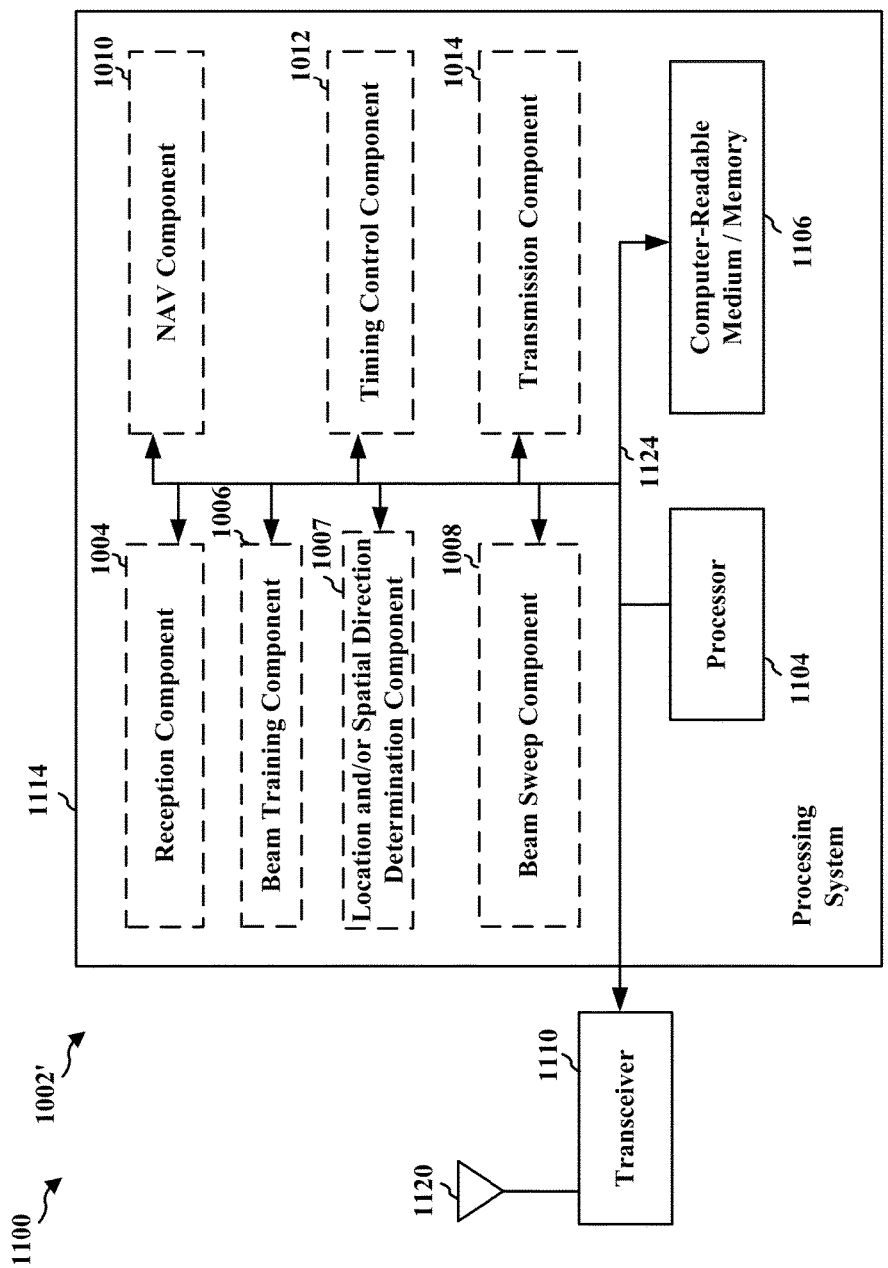
FIG. 11 is a diagram illustrating an example of a hardware implementation for an apparatus employing a processing system.

FIG. 11 is a diagram 1100 illustrating an example of a hardware implementation for an apparatus 1002' employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware components, represented by the processor 1104, the components 1004, 1006, 1007, 1008, 1010, 1012, 1014 and the computer-readable medium/memory 1106. The bus 1124 may also link various other circuits such as timing sources, peripherals, voltage regulators, and power management circuits, which are well known in the art, and therefore, will not be described any further.

The processing system 1114 may be coupled to a transceiver 1110. The transceiver 1110 is coupled to one or more antennas 1120. The transceiver 1110 provides a means for communicating with various other apparatus over a transmission medium. The transceiver 1110 receives a signal from the one or more antennas 1120, extracts information from the received signal, and provides the extracted information to the processing system 1114, specifically the reception component 1004. In addition, the transceiver 1110 receives information from the processing system 1114, specifically the transmission component 1014, and based on the received information, generates a signal to be applied to the one or more antennas 1120. The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system 1114 further includes at least one of the components 1004, 1006, 1007, 1008, 1010, 1012, 1014. The components may be software components running in the processor 1104, resident/stored in the computer readable medium/memory 1106, one or more hardware components coupled to the processor 1104, or some combination thereof. In one configuration, the processing system 1114 may be a component of the eNB 310 and may include the memory 376 and/or at least one of the TX processor 316, the RX processor 370, and the controller/processor 375. In another configuration, the processing system 1114 may be a component of the UE 350 and may include the memory 360 and/or at least one of the TX processor 368, the RX processor 356, and the controller/processor 359.

In one configuration, the apparatus 1002/1002' for wireless communication includes means for determining spatial directions of a plurality of wireless devices including a device, e.g., a first transmitter, and at least one other transmitter. The apparatus 1002/1002' may further include means for performing, based on the determined spatial directions, a beam sweep for receiving one or more RTS messages. The means for performing the beam sweep may be configured to listen for an RTS message in at least one of the determined spatial directions. In one configuration, the apparatus may further include means for determining that the RTS message for a data transmission is received from the first transmitter at a first spatial direction of the determined spatial directions. In some such configurations, the apparatus may include means for transmitting a CTS message for the data transmission to the first transmitter. In an aspect, the CTS message may be transmitted in a beamformed manner in the first spatial direction. In another aspect, the CTS is transmitted in an omni-directional manner. In another configuration, the apparatus may include means for transmitting, to the at least one other transmitter, information indicating that the CTS message has been transmitted to the first transmitter. The information may be beamformed to each of the transmitters of the at least one other transmitter in each of the determined spatial directions other than the first spatial direction. In some configurations, the RTS message may include a duration field, and the apparatus may include means for setting a NAV based on the duration field in the RTS message. In some such configurations, the CTS message may be beamformed to the first transmitter device after the NAV has expired. In an aspect, the duration field may indicate the duration of the RTS message. In some configurations, a NAV may be transmitted in the CTS message via beamforming, and the apparatus may include means for receiving the data transmission, e.g., from the first transmitter, based on the NAV included with the CTS message. In another aspect, the NAV may indicate the duration of the CTS message. In an aspect, the apparatus may be one of a base station, an access point, a relay, a UE, or a CPE. In another aspect, the second wireless device may be one of a base station, an access point, a relay, a UE, or a CPE.

In one configuration, the aforementioned means may be one or more of the aforementioned components of the apparatus 1002 and/or the processing system 1114 of the apparatus 1002' configured to perform the functions recited by the aforementioned means. As described supra, the processing system 1114 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

In another configuration, the aforementioned means may be one or more of the aforementioned components of the apparatus 1002 and/or the processing system 1114 of the apparatus 1002' configured to perform the functions recited by the aforementioned means. As described supra, the processing system 1114 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 12:
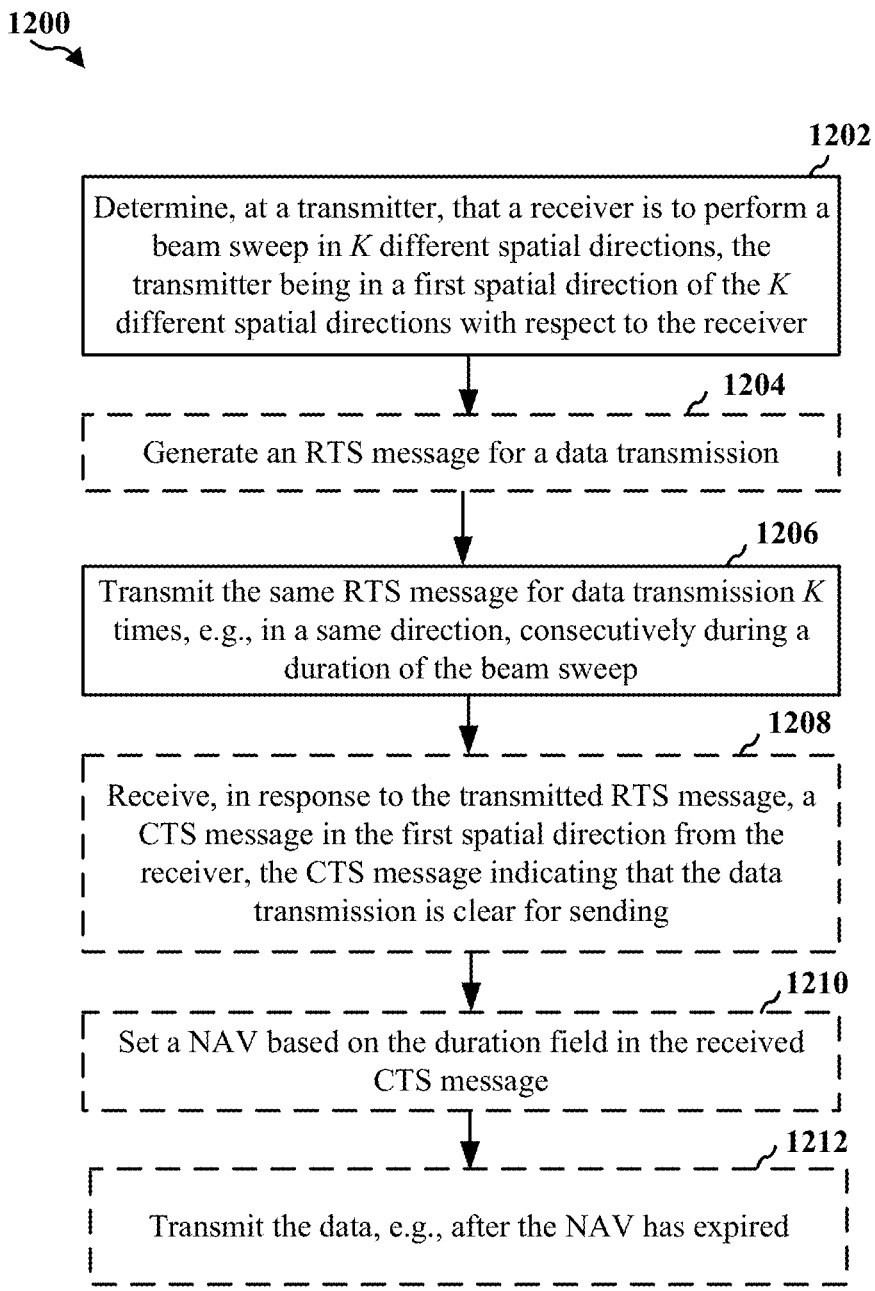
FIG. 12 is a flowchart of an exemplary method of wireless communication of a transmitter.

FIG. 12 is a flowchart 1200 of a method of wireless communication. The method may be performed by an apparatus (e.g., the UE 712, the base station 720, the apparatus 1402/1402'). At 1202, the apparatus may determine that a receiver is to perform a beam sweep in K different spatial directions, the apparatus being in a first spatial direction of the K different spatial directions with respect to the receiver. For example, referring to FIG. 7, the apparatus may be the UE 712, and the receiver may be the base station 720. In this particular example, the UE 712 may determine that the base station 720 is to perform a beam sweep in K different spatial directions. The UE 712 may be in a first spatial direction of the K different spatial directions with respect to the base station 720. The determination may be based on, e.g., a message from the base station 720 indicating that the base station 720 will perform a beam sweep in K different spatial directions. The message may further include information indicating a duration of the beam sweep, e.g., the time period to complete one beam sweep to listen/scan in the K spatial directions. In some configurations, the determination that a receiver is to perform a beam sweep in multiple different spatial directions may be based on information obtained by the apparatus during beam training phase of operation, e.g., during a beamforming training interval 464, and/or information obtained during the announcement transmission interval 466. In some other embodiments the determination may be based on preconfigured information stored in the apparatus which may be updated periodically, e.g., based on updates received from the receiver, e.g., base station. In still some other embodiments the determination may be based on information provided to the apparatus during an initialization phase when the apparatus, e.g., a UE, synchronizes with the receiver, e.g., base station, and/or exchanges setup and other configuration information.

At 1204, the apparatus may generate an RTS message to acquire the wireless medium for a data transmission. For example, referring to FIG. 7, the UE 712 may generate the RTS message 750 for transmission to the base station 720. In some embodiments the generated RTS message has the same length as a standard RTS message.

At 1206, the apparatus may transmit the same RTS message for the data transmission K times in a same direction during a duration of the beam sweep. For example, referring to FIG. 7, the UE 712 may transmit the RTS message 750 K times (multiple transmissions of RTS message 750 are indicated with a prime appended to reference number 750) in the same direction to the base station 720 duration a duration of the beam sweep by the base station 720. In some configurations the RTS message may be transmitted K times consecutively. In some configurations the RTS message may be transmitted K times periodically within the duration of the beam sweep. As the apparatus, e.g., UE 712, does not know the sweeping pattern and/or time interval during which the receiver, e.g., base station 720, will perform beam sweep in the first spatial direction (which corresponds to the transmission direction of the UE 712) to listen to the RTS transmitted by the UE 712, the UE 712 transmits the RTS message K times so that the RTS message can be detected and received by the base station 720 during at least one of the directional scans performed by the base station 720 in the spatial directions of the transmitters, as part of performing a beam sweep in K different spatial directions.

At 1208, the apparatus may receive, in response to the transmitted RTS message, a CTS message in the first spatial direction from the receiver. The CTS message may indicate that a data transmission can be sent. For example, referring to FIG. 7, the UE 712 may receive, in response to the RTS message 750, the CTS message 752. The CTS message 752 may have been beamformed by the base station 720, e.g., transmitted in a directional manner in the first spatial direction. The CTS message 752 may be received in the same spatial direction in which the RTS message 750 was transmitted. The RTS message 750 may include a duration field. In one configuration, the duration field of the RTS message may indicate the duration of the RTS message 750. In some embodiments the CTS may be received based on the duration field of the RTS message. In one configuration, the duration field of the RTS message may indicate the duration of the RTS message 750. For example, referring to FIG. 7, in one configuration the base station 720 transmitting the CTS 752 may use the duration field of the received RTS message 750 as a reference for duration calculation. The base station 720 may subtract, the time needed for the CTS message 752 transmission and a short interframe spacing (SIFS) time period prior to CTS message 752 transmission, from the duration field of the RTS 750 and use this subtracted value in the duration field of the CTS 752.

At 1210, the apparatus may set a NAV based on a duration field in the CTS message. For example, referring to FIG. 7, the UE 712 may set the NAV based on the duration field indicated in the CTS message 752. That is, the UE 712 may set the NAV value equal to a value indicated in the duration field of the CTS message 752 or a value calculated based on the value indicated in the duration field of the CTS message 752. In some configurations, the NAV may be used to trigger transmission of data by the UE 712. For instance, the UE 712 may set the NAV according to the duration of the CTS message 752. After the NAV expires (a NAV counter counts down to 0), the UE 712 may transmit the data. In another configuration, the duration field of CTS message 752 may indicate and reserve a time period after the CTS message 752 that includes a duration of a data message, an acknowledgment message, and any interframe space in between messages. In some such configurations, the UE 712 may receive the CTS message 752 and may transmit the data transmission before the expiration of the time period indicated in the duration field of the CTS message 752.

At 1212, the apparatus may transmit the data to the receiver. In some configurations the data may be transmitted after the NAV has expired. For example, referring to FIG. 7, the UE 712 may transmit the data after the NAV has expired if the NAV is set to the duration of the CTS message 752 indicated in the duration field of the CTS message 752. In another example, if the duration indicated in the duration field indicates a length of time for transmitting the data and receiving an ACK, the UE 712 may transmit the data before the indicated duration for transmitting the data expires. In some such configurations, the UE 712 may not set the NAV or may set the NAV to a value that expires before the duration of data transmission begins. In some embodiments the data is transmitted in a directional manner.

Figure 13:
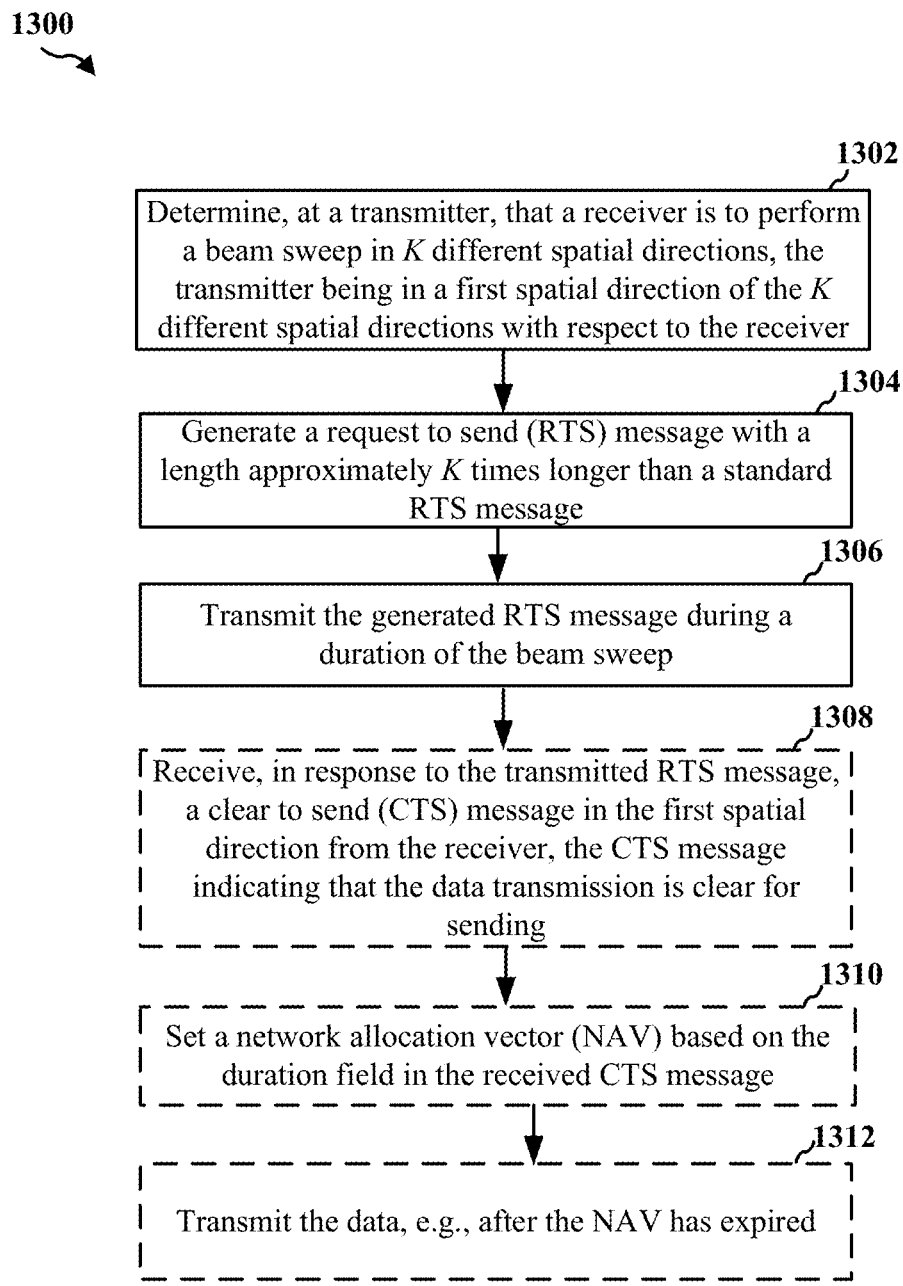
FIG. 13 is a flowchart of yet another exemplary method of wireless communication of a transmitter.

FIG. 13 is a flowchart 1300 of a method of wireless communication. The method may be performed by an apparatus (e.g., the UE 812, the base station 820, the apparatus 1402/1402'). At 1302, the apparatus may determine that a receiver is to perform a beam sweep in K different spatial directions, the apparatus being in a first spatial direction of the K different spatial directions with respect to the receiver. For example, referring to FIG. 8, the apparatus may be the UE 812, and the receiver may be the base station 820. In this particular example, the UE 812 may determine that the base station 820 is to perform a beam sweep in K different spatial directions. The UE 812 may be in a first spatial direction of the K different spatial directions with respect to the base station 820. The determination that a receiver is to perform a beam sweep in multiple different spatial directions may be based on information obtained by the apparatus during a beamforming training interval 464 and/or announcement transmission interval 466 of operation. For example, the determination may be based on, e.g., a message from the base station 720 indicating that the base station 720 will perform a beam sweep in K different spatial directions, and indicating a duration of the beam sweep. In some other configurations, the determination may be based on preconfigured information stored in the apparatus which may be updated periodically, e.g., based on updates receiver from the receiver, e.g., base station. In still some other embodiments the determination may be based on information provided to the apparatus during initialization when the apparatus, e.g., a UE, synchronizes with the receiver, e.g., base station, and/or exchanges setup and other configuration information.

At 1304, the apparatus may generate an RTS message with a length, e.g., duration, approximately K times longer than a duration of a standard RTS message. The length of the RTS message may indicate the duration for which the generated RTS message is transmitted and/or the duration for which the transmission of the generated RTS message continues. For example, referring to FIG. 8, the UE 812 may generate the RTS message 855 with a length approximately K times longer than a standard RTS message for transmission to the base station 820. For example, having the knowledge that the receiver performs a beam sweep in K different spatial directions during the duration of a beam sweep, the apparatus may decide to configure the length of the generated RTS message based on the duration of beam sweep in which K spatial directions are scanned.

At 1306, the apparatus may transmit the generated RTS message for the data transmission during a duration of the beam sweep. For example, referring to FIG. 8, the UE 812 may transmit the RTS message 855 having a length times longer than a standard RTS message to the base station 820. While the UE 812 does not know exactly when the base station 820 is to perform a beam sweep in the first spatial direction corresponding to UE 812, the UE 812 may know that base station 820 will perform a beam sweep in K different spatial directions including the first spatial direction and the duration of the beam sweep. Therefore by transmitting the RTS message 855 which has a longer duration (e.g., K times than a standard RTS) the UE 812 may ensure that RTS message will be heard by the base station 820 at least during one period/interval during the beam sweep, since the RTS message 855 is transmitted during the duration of the beam sweep for a prolonged time owing to the longer length of the RTS message 855.

At 1308, the apparatus may receive, in response to the transmitted RTS message, a CTS message in the first spatial direction from the receiver. The CTS message may indicate that a data transmission can be sent. For example, referring to FIG. 8, the UE 812 may receive, in response to the RTS message 855, the CTS message 852. The CTS message 852 may have been beamformed by the base station 820, e.g., transmitted in a directional manner in the first spatial direction. The CTS message 852 may be received in the same spatial direction in which the RTS message 855 was transmitted. In some other configurations, the CTS message 852 may be transmitted in an omni-directional manner by the base station 820. In some embodiments, the RTS message 855 may include a duration field. In one configuration, the duration field of the RTS message may indicate the duration of the RTS message 855. In some embodiments, the CTS message 852 may be received based on the duration field of the RTS message 855. For example, in one configuration, the base station 820 transmitting the CTS 852 may use the duration field of the received RTS message 855 as a reference for duration calculation. The base station 820 may subtract the time needed for the CTS message 852 transmission and an SIFS time period prior to CTS message 852 transmission from the duration field of the RTS 855 and use this subtracted value in the duration field of the CTS 852.

At 1310, the apparatus may set a NAV based on a duration field in the CTS message. In one example, referring to FIG. 8, the UE 812 may set the NAV based on the duration field indicated in the CTS message 852. That is, the UE 812 may make the NAV value equal to a value indicated in the duration field of the CTS message 852 or a value calculated based on the value indicated in the duration field of the CTS message 852. In some, but not all embodiments, the NAV may be used to trigger transmission of data by the UE 812. For instance, the UE 812 may set the NAV according to the duration of the CTS message 852. After the NAV expires (a NAV counter counts down to 0), the UE 812 may transmit the data. In another configuration, the duration field of CTS message 852 may indicate and reserve a time period after the CTS message 852 that includes a duration of a data message, an acknowledgment message, and any interframe space in between messages. In some such configurations, the UE 812 may receive the CTS message 852 and may transmit the data transmission before the expiration of the time period indicated in the duration field of the CTS message 852.

At 1312, the apparatus may transmit the data to the receiver. In some configurations the data may be transmitted after the NAV has expired. For example, referring to FIG. 8, the UE 812 may transmit the data after the NAV has expired if the NAV is set to the duration of the CTS message 852 indicated in the duration field of the CTS message 852. In another example, if the duration indicates a length of time for transmitting the data and receiving an ACK, the UE 812 may transmit the data before the duration expires. In some such configuration, the UE 812 may not set the NAV or may set the NAV to a value that expires before the duration of data transmission begins. In some embodiments the data is transmitted in a directional manner.

Figure 14:
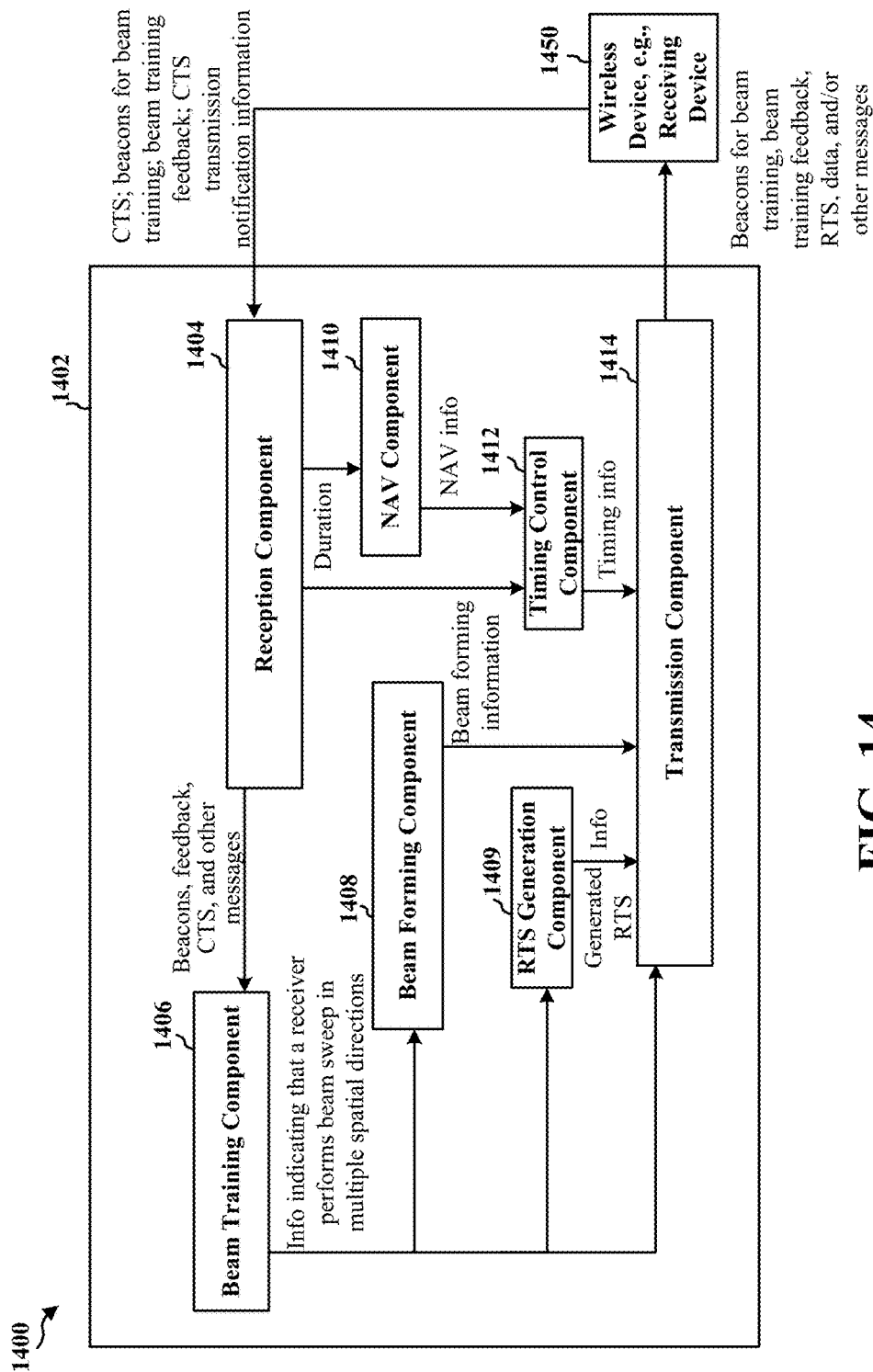
FIG. 14 is a conceptual data flow diagram illustrating the data flow between different means/components in an exemplary apparatus.

FIG. 14 is a conceptual data flow diagram 1400 illustrating the data flow between different means/components in an exemplary apparatus 1402. The apparatus may be UE (e.g., UE 712/812), a CPE, a base station (e.g., base station 720/820), or another device. The apparatus may include a reception component 1404, a beam training component 1406, a beam forming component 1408, an RTS generation component 1409, a NAV component 1410, a timing control component 1412, and a transmission component 1414.

The reception component 1404 may be configured to receive and process messages and/or other information from other devices, e.g., such as for example beacons for beam training, beam training feedback, CTS messages, CTS transmission notifications, and/or messages from the receiving device 1450, e.g., a receiver such as the base station 720/820. For example, in some configurations, the reception component 1404 may be configured to receive a message from the receiving device 1450 (e.g., base station 720/820) indicating a beam sweep in K different spatial directions will be performed by the receiver 1450 to listen/scan for RTS message transmissions. The message may further include information indicating a duration of the beam sweep, e.g., the time period to complete one beam sweep to listen/scan in the K spatial directions. In various configurations the messages and/or information received by the reception component 1404 may be provided to one or more components, e.g., beam training component 1406, for further processing so that received information may be appropriately used for the operation of the apparatus in accordance with the features described above with respect to flowcharts 1200 and 1300.

The beam training component 1406 may be configured to perform beam training related operations during the beam training phase (e.g., beamforming training interval 464) and may be further configured to determine that a receiver is to perform a beam sweep in K different spatial directions, based on information received from the receiving device 1450. For example, with reference to FIGS. 7-8, the determination may be based on the message from the base station 720/820 indicating that the base station 720/820 is to perform a beam sweep in K different spatial directions. In some configurations, the message may be received during the beam training phase, e.g., beamforming training interval 464, and/or during the announcement transmission interval 466. In some other configurations, the determination may be based on preconfigured information stored in the apparatus and/or information provided to the apparatus during initialization and/or connection setup. The determined information indicating that a receiver is to perform a beam sweep in multiple (e.g., K) different spatial directions is provided to one or more components of the apparatus as shown. In one configuration the apparatus may be in a first spatial direction of the K different spatial directions with respect to the receiver.

The beamforming component 1408 maybe configured to provide beam forming information to the transmission component 1414. The beamforming information may indicate which antennas, weights, delays and/or other parameters should be used for transmission of messages, e.g., RTS messages and/or CTS messages, in different spatial directions for maximum or optimal reach in the different spatial directions. Thus, the beamforming component 1408 may control the transmission component to perform message transmission in accordance with various aspects discussed above with respect to flowcharts 1200 and 1300. The RTS generation component 1409 may be configured to generate RTS messages for transmission, e.g., to another wireless device such as wireless device 1450 which may be a receiver such as the base station 720/820 in some configurations. In some configurations, the RTS generation component 1409 may be configured to generate an RTS message with a length which is the same as that of a standard RTS message. In some other configurations, the RTS generation component 1409 may be configured to generate an RTS message with a length approximately K times longer than a standard RTS message. For example, the K times longer length of the RTS message may indicate the longer duration for which the generated RTS message is to be transmitted and/or the duration for which the transmission of the generated RTS message should continue. In each configuration, the RTS generation component 1409 provides information to the transmission component 1414 on the type of generated RTS message and how the RTS message is to be transmitted. Based on such information provided by the RTS generation component 1409, the transmission component 1414 may transmit a given type of generated RTS message accordingly.

The beamforming component 1408 or the transmission component 1414 alone or in combination, may be configured to transmit the generated RTS message during a duration of the beam sweep. For example, the beamforming component 1408 and the transmission component 1414 may work in coordination to transmit one or more RTS messages during a duration of the beam sweep performed by the receiver, e.g., base station 720/820. For example, in some configurations, the beamforming component 1408 may control the transmission component 1414 to transmit multiple RTS messages in a beamformed (e.g., directional) manner in the same direction. In some configurations, the beamforming component 1408 may control the transmission component 1414 to transmit the same RTS message K times in the same direction consecutively during a duration of the beam sweep, e.g., based on control information and/or beamforming information provided by the beamforming component 1408. In some other configurations, where an RTS message with a length approximately K times longer than a standard RTS message is generated by the RTS generation component 1409 for transmission, the beamforming component 1408 may control the transmission component 1414 to transmit the longer length RTS message during the beam sweep duration, e.g., time period during which the receiver performs a beam sweep in the K different spatial directions. For example, in one such a configuration, the transmission component 1414 may be configured to transmit the generated RTS message (with length approximately K times longer for a longer duration based on the length of the generated RTS message.

The reception component 1404 may be configured to receive, in response to the transmitted RTS message, a CTS message in the first spatial direction from the receiver. The CTS message may indicate that the data transmission is clear for sending data to the receiver. In an aspect, the CTS message may be transmitted by the receiver, e.g., base station 720/820, in a beamformed manner in the first spatial direction corresponding to the direction of the apparatus 1402. In another aspect, the CTS is transmitted in an omni-directional manner. Thus the received CTS message may have been beamformed in the first spatial direction in some embodiments. In one configuration, the RTS message may include a duration field, and the CTS message is received by the reception component 1404 based on the duration field in the RTS message. In one such configuration the duration field of the RTS message indicates a duration of the RTS message.

The beam forming component 1408 or the transmission component 1414 may be further configured to transmit the data to the receiver 1450 after the CTS has been received. In one configuration, the CTS message may include a duration field, and the NAV component 1410 may be configured to set a NAV based on the duration field in the CTS message. The NAV may indicate the duration of the CTS message. In some such configurations, the beam forming component 1408 or the transmission component 1414 is further configured to transmit the data transmission after the NAV has expired. The timing control component 1412 may be configured to provide transmission timing information to the transmission component 1414 to control transmission of the actual data, e.g., based on NAV information and/or other transmission timing control information.

In some embodiments the apparatus may be one of a UE, or a CPE, a base station, an access point or a relay. In some embodiments the receiver may be one of a base station, an access point, a relay, a UE or a CPE.

The apparatus may include additional components that perform each of the blocks of the algorithm in the aforementioned flowcharts of FIG. 12 and FIG. 13. As such, each block in the aforementioned flowcharts of FIG. 12 and FIG. 13 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 15:
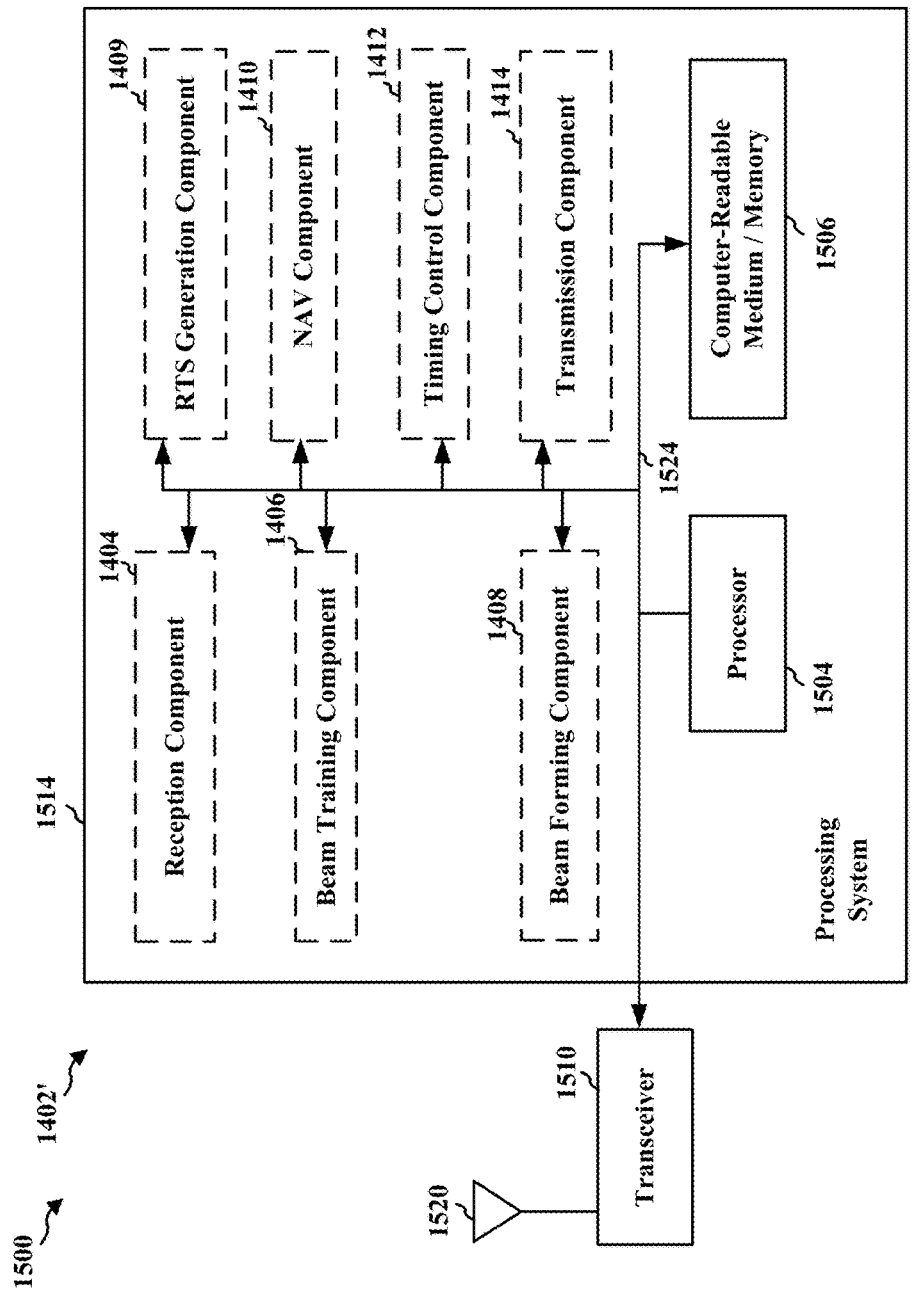
FIG. 15 is a diagram illustrating an example of a hardware implementation for an apparatus employing a processing system.

FIG. 15 is a diagram 1500 illustrating an example of a hardware implementation for an apparatus 1402' employing a processing system 1514. The processing system 1514 may be implemented with a bus architecture, represented generally by the bus 1524. The bus 1524 may include any number of interconnecting buses and bridges depending on the specific application of the processing system 1114 and the overall design constraints. The bus 1524 links together various circuits including one or more processors and/or hardware components, represented by the processor 1104, the components 1404, 1406, 1408, 1409, 1410, 1412, 1414 and the computer-readable medium/memory 1506. The bus 1524 may also link various other circuits such as timing sources, peripherals, voltage regulators, and power management circuits, which are well known in the art, and therefore, will not be described any further.

The processing system 1514 may be coupled to a transceiver 1510. The transceiver 1510 is coupled to one or more antennas 1520. The transceiver 1510 provides a means for communicating with various other apparatus over a transmission medium. The transceiver 1510 receives a signal from the one or more antennas 1520, extracts information from the received signal, and provides the extracted information to the processing system 1514, specifically the reception component 1404. In addition, the transceiver 1510 receives information from the processing system 1514, specifically the transmission component 1414, and based on the received information, generates a signal to be applied to the one or more antennas 1520. The processing system 1514 includes a processor 1504 coupled to a computer-readable medium/memory 1506. The processor 1504 is responsible for general processing, including the execution of software stored on the computer-readable medium/memory 1506. The software, when executed by the processor 1504, causes the processing system 1514 to perform the various functions described supra for any particular apparatus. The computer-readable medium/memory 1506 may also be used for storing data that is manipulated by the processor 1504 when executing software. The processing system 1514 further includes at least one of the components 1404, 1406, 1408, 1409, 1410, 1412, 1414. The components may be software components running in the processor 1504, resident/stored in the computer readable medium/memory 1506, one or more hardware components coupled to the processor 1504, or some combination thereof. In one configuration, the processing system 1514 may be a component of the eNB 310 and may include the memory 376 and/or at least one of the TX processor 316, the RX processor 370, and the controller/processor 375. In another configuration, the processing system 1514 may be a component of the UE 350 and may include the memory 360 and/or at least one of the TX processor 368, the RX processor 356, and the controller/processor 359.

In one configuration, the apparatus 1402/1402' for wireless communication includes means for determining that a receiver is to perform a beam sweep in K different spatial directions, where the apparatus 1402/1402' is in a first spatial direction of the K different spatial directions with respect to the receiver. The apparatus 1402/1402' may further comprise means for transmitting a same RTS message for a data transmission K times in a same direction consecutively during a duration of the beam sweep. In another configuration, the apparatus 1402/1402' for wireless communication further includes means for generating an RTS message with a length approximately K times longer than a standard RTS message. In some such configurations, the means for transmitting is configured to transmit the generated RTS message with the length approximately K times longer than a standard RTS message during a duration of the beam sweep.

In one configuration, the apparatus 1402/1402' may further include means for receiving, in response to the transmitted RTS message, a CTS message beamformed in the first spatial direction from the receiver. The CTS message may indicate that the data transmission is clear for sending. In one configuration, the RTS message may include a duration field, and the CTS message is received by the means for receiving based on the duration field of the RTS message. In one aspect, the duration field of the RTS message may indicate the duration of the RTS message.

In some configurations, the received CTS message may include a duration field, and the apparatus 1402/1402' may include means for setting a NAV based on the duration field in the CTS message. In one aspect, the NAV may indicate the duration of the CTS message. In some, but not all embodiments, the NAV may be used to trigger transmission of data by the apparatus 1402/1402'. In some configurations the means for transmitting is configured to transmit the data after the NAV has expired. In some other configurations, the duration indicates a length of time for transmitting the data and receiving an ACK. In some such configurations, the means for transmitting may be configured to transmit the data before the duration expires. In some such configurations, the means for setting the NAV may set the NAV to a value that expires before the duration of data transmission begins so that data transmission can start at the appropriate time.

In one configuration, the aforementioned means may be one or more of the aforementioned components of the apparatus 1402 and/or the processing system 1514 of the apparatus 1402' configured to perform the functions recited by the aforementioned means. As described supra, the processing system 1514 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

In another configuration, the aforementioned means may be one or more of the aforementioned components of the apparatus 1402 and/or the processing system 1514 of the apparatus 1402' configured to perform the functions recited by the aforementioned means. As described supra, the processing system 1514 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a receiver, comprising:
    determining spatial directions of a plurality of transmitters including a first transmitter and at least one other transmitter for detecting one or more request to send (RTS) messages transmitted in the spatial directions; and
    performing, based on the determined spatial directions, a beam sweep for receiving the one or more RTS messages, said performing the beam sweep comprising listening for an RTS message in each of the determined spatial directions.

2. The method of claim 1, further comprising:
    transmitting information indicating that the receiver is to perform the beam sweep in K different spatial directions and indicating a duration of the beam sweep.

3. The method of claim 1, further comprising:
    determining that an RTS message for a data transmission is received from the first transmitter at a first spatial direction of the determined spatial directions; and
    transmitting a clear to send (CTS) message for the data transmission to the first transmitter at the first spatial direction.

4. The method of claim 3, wherein the CTS message is transmitted in a beamformed manner in the first spatial direction.

5. The method of claim 3, wherein the CTS message is transmitted in an omni directional manner.

6. The method of claim 3, further comprising transmitting, to the at least one other transmitter, information indicating that the CTS message has been transmitted, the information being beamformed to each transmitter of the at least one other transmitter in each of the determined spatial directions other than the first spatial direction.

7. The method of claim 3, wherein the RTS message includes a duration field, the method further comprising:
    setting a network allocation vector (NAV) based on the duration field in the RTS message, said CTS message being beamformed to the first transmitter in the first spatial direction after expiration of the NAV.

8. The method of claim 3, wherein a network allocation vector (NAV) is sent in the CTS message, the method further comprising receiving the data transmission based on the NAV sent in the CTS message.

9. The method of claim 1, wherein said receiver is one of a base station, an access point or a relay.

10. A wireless communication device, comprising:
    a memory; and
    at least one processor coupled to the memory and configured to:
        determine spatial directions of a plurality of transmitters including a first transmitter and at least one other transmitter for detecting one or more request to send (RTS) messages transmitted in the spatial directions; and
        perform, based on the determined spatial directions, a beam sweep for receiving the one or more RTS messages, said performing the beam sweep comprising listening for an RTS message in each of the determined spatial directions.

11. The wireless communication device of claim 10, wherein the at least one processor is further configured to:
    transmit information indicating that the wireless communication device is to perform the beam sweep in K different spatial directions and indicating a duration of the beam sweep.

12. The wireless communication device of claim 10, wherein the at least one processor is further configured to:
    determine that an RTS message for a data transmission is received from the first transmitter at a first spatial direction of the determined spatial directions; and
    transmit a clear to send (CTS) message for the data transmission to the first transmitter at the first spatial direction.

13. The wireless communication device of claim 12, wherein the at least one processor is further configured to transmit the CTS message in a beamformed manner in the first spatial direction.

14. The wireless communication device of claim 12, wherein the at least one processor is further configured to transmit, to the at least one other transmitter, information indicating that the CTS message has been transmitted, the information being beamformed to each transmitter of the at least one other transmitter in each of the determined spatial directions other than the first spatial direction.

15. The wireless communication device of claim 12, wherein the RTS message includes a duration field; and
    wherein the at least one processor is further configured to set a network allocation vector (NAV) based on the duration field in the received RTS message, said CTS message being beamformed to the first transmitter in the first spatial direction after expiration of the NAV.

16. A method of wireless communication of a transmitter, comprising:
    determining that a receiver is to perform a beam sweep in K different spatial directions based on a message from the receiver, the transmitter being in a first spatial direction of the K different spatial directions with respect to the receiver; and
    transmitting, based on the message from the receiver, a same request to send (RTS) message for a data transmission K times in a same direction consecutively during a duration of the beam sweep.

17. The method of claim 16, wherein the message from the receiver indicates that the receiver is to perform the beam sweep in K different spatial directions and indicates the duration of the beam sweep.

18. The method of claim 16, further comprising:
    receiving, in response to the transmitted RTS message, a clear to send (CTS) message beamformed in the first spatial direction from the receiver, the CTS message indicating that the data transmission is clear for sending.

19. The method of claim 18, wherein the RTS message includes a duration field, and wherein the CTS message is received based on the duration field of the RTS message.

20. The method of claim 19, wherein the duration field of the RTS message indicates a duration of the RTS message.

21. The method of claim 18, wherein the CTS message includes a duration field, the method further comprising:
setting a network allocation vector (NAV) based on the duration field in the CTS message; and
transmitting the data transmission after the NAV has expired.

22. The method of claim 16, wherein said transmitter is one of a user equipment (UE) or a customer premises equipment (CPE).

23. The method of claim 16, wherein said receiver is one of a base station, an access point, a relay, a user equipment (UE) or a customer premises equipment (CPE).

24. A wireless communication device, comprising:
a memory; and
at least one processor coupled to the memory and configured to:
determine that a receiver is to perform a beam sweep in K different spatial directions based on a message from the receiver, the wireless communication device being in a first spatial direction of the K different spatial directions with respect to the receiver; and
transmit, based on the message from the receiver, a same request to send (RTS) message for a data transmission K times in a same direction consecutively during a duration of the beam sweep.

25. The wireless communication device of claim 24, wherein the message from the receiver indicates that the receiver is to perform the beam sweep in the K different spatial directions and indicates the duration of the beam sweep.

26. The wireless communication device of claim 24, wherein the at least one processor is further configured to:
receive, in response to the transmitted RTS message, a clear to send (CTS) message beamformed in the first spatial direction from the receiver, the CTS message indicating that the data transmission is clear for sending.

27. The wireless communication device of claim 26, wherein said at least one processor is further configured to generate the RTS message and include a duration field in the RTS message, and wherein the CTS message is received based on the duration field of the RTS message.

28. The wireless communication device of claim 27, wherein the duration field of the RTS message indicates a duration of the RTS message.

29. The wireless communication device of claim 26, wherein the CTS message includes a duration field, and wherein the at least one processor is further configured to:
set a network allocation vector (NAV) based on the duration field in the CTS message; and
transmit the data transmission after the NAV has expired.

30. The wireless communication device of claim 24, wherein said wireless communication device is one of a user equipment (UE) or a customer premises equipment (CPE) and the receiver is one of a base station, an access point, or a relay.

* * * * *